United States Patent
Narayanan et al.

(10) Patent No.: US 7,746,116 B1
(45) Date of Patent: Jun. 29, 2010

(54) METHOD AND APPARATUS TO CLOCK-GATE A DIGITAL INTEGRATED CIRCUIT BY USE OF FEED-FORWARD QUIESCENT INPUT ANALYSIS

(75) Inventors: Sridhar Narayanan, Cupertino, CA (US); Chaiyasit Manovit, Mountain View, CA (US); Sridhar Subramanian, Cupertino, CA (US); Gerald Gras, Palo Alto, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/356,797

(22) Filed: Jan. 21, 2009

(51) Int. Cl.
*H03K 19/00* (2006.01)
(52) U.S. Cl. .............................. 326/93; 326/94; 326/95
(58) Field of Classification Search .................. 327/199, 327/202, 212, 225
See application file for complete search history.

(56) References Cited

U.S. PATENT DOCUMENTS 6,275,081 B1 * 8/2001 Flake .......................... 327/202
2004/0225978 A1 * 11/2004 Fan et al. ........................ 716/6

\* cited by examiner

*Primary Examiner*—Anh Q Tran
(74) *Attorney, Agent, or Firm*—Fernandez & Associates, LLP

(57) ABSTRACT

One aspect of the invention relates to a device including a first storage element and a first clock gating element, wherein a data input of the first storage element is coupled to an output of a combinatorial logic (CL) element, wherein the first storage element is clock-gated with the first clock gating element using a first clock enable signal to generate a clock signal for the first storage element, wherein the first clock enable signal is generated to suppress the clock signal in the first clock gating element when each of the at least one data input of the CL element is in a second quiescence inducing condition with respect to the clock signal at the same time as when each of the at least one control input of the CL element is in the first quiescence inducing condition.

14 Claims, 15 Drawing Sheets

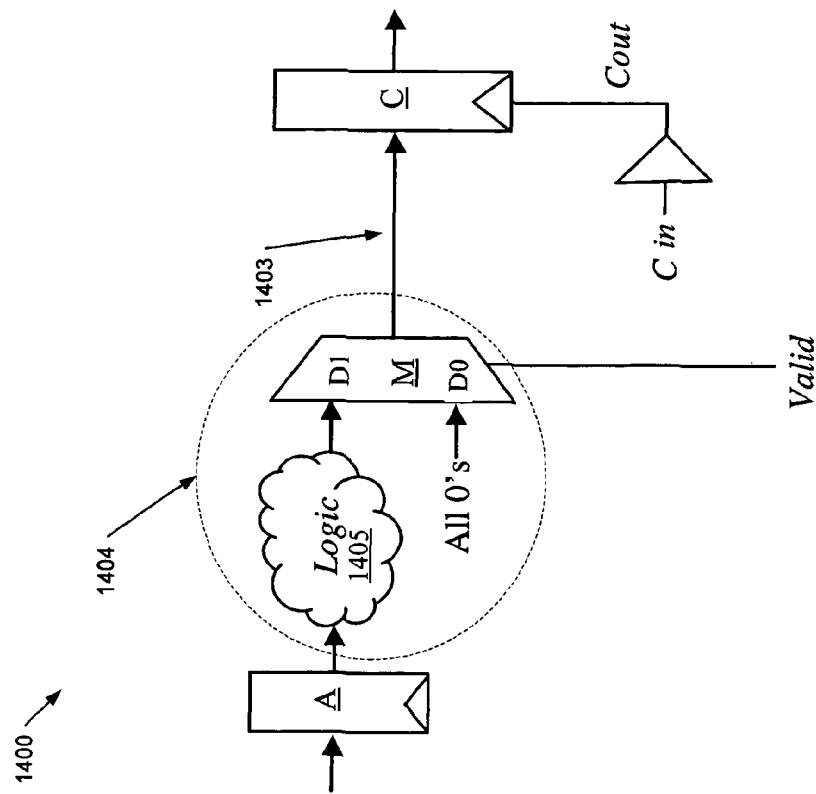
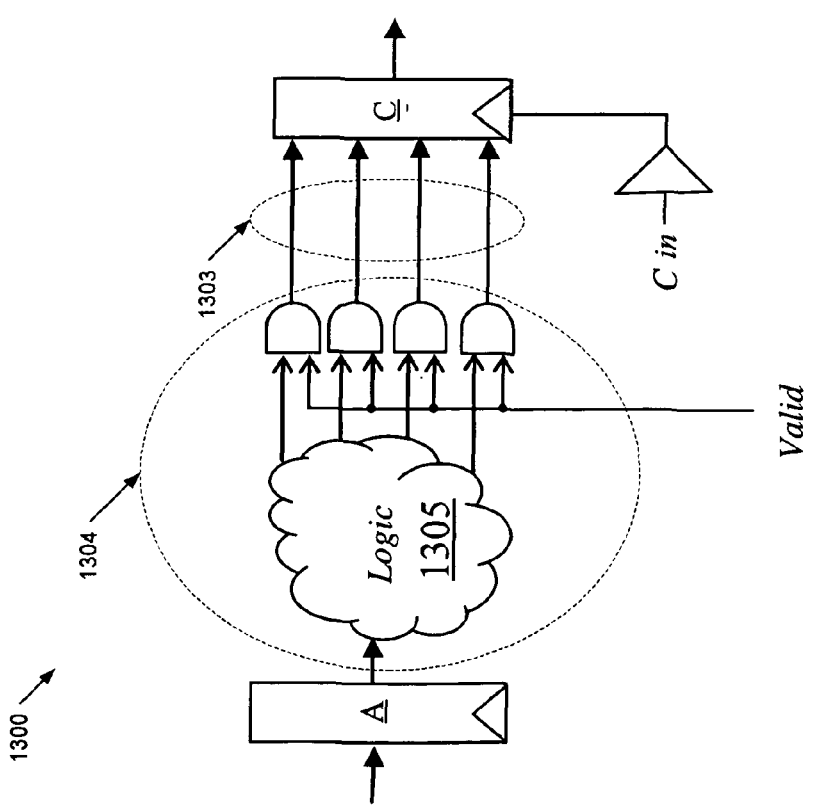
Figure 14
Figure 13

METHOD AND APPARATUS TO CLOCK-GATE A DIGITAL INTEGRATED CIRCUIT BY USE OF FEED-FORWARD QUIESCENT INPUT ANALYSIS

BACKGROUND

1. Field of the Invention

The present invention pertains to the field of integrated circuit design.

More particularly, the present invention pertains to a process for optimizing power consumption in the design of complex integrated circuits.

2. Background of the Invention

The use of clock gating is a design technique used in digital integrated circuits to reduce dynamic power. As shown in FIG. 1 depicting circuit (100), the main idea is to replace the last stage of the clock network (not shown) with a gating element (101) that is controlled by an enable signal. The input clock Cin to the gating element (101) is from the clock network and the output clock Cout is used to drive the clock ports (i.e., clock inputs or clock input ports) of one or more storage element(s) (102) in the circuit (100). When the enable signal is asserted, the output clock Cout of the gating element (101) follows the input clock Cin, and the storage element(s) (102) are clocked. This allows the storage element(s) (102) to be updated with the state values at their inputs. Conversely, when the enable signal is deasserted, the output clock Cout is forced either to a logic 1 or logic 0. This results in the storage element(s) (102) retaining their previous state values, and not getting updated with the state values at their inputs. This suppression of clock activity on Cout when the enable signal is deasserted provides the main savings in dynamic power with the use of clock gating. In the example described above, the storage element(s) (102) are said to be clock-gated with the gating element (101) using the enable signal to enable the Cin clock signal for the clock port of the storage element(s) (102). Throughout this document in the same manner as the above description, a name (e.g., Cin) may be used to refer, interchangeably, to an electrical signal (e.g., Cin clock signal), a physical pin carrying the electrical signal (e.g., Cin pin), or a logical port implemented by the physical pin (e.g., clock input port of the gating element (101)). Those skilled in the art will appreciate the storage element(s) (102) may refer to a single storage element with a single-bit input/output or multiple storage elements with multi-bit inputs/outputs without deviating from the spirit of the invention. Throughout this document and in all Figures, the singular term storage element(s), input(s), output(s), and clock(s) are intended to include the plural forms thereof unless specifically excluded.

Clock gating a digital integrated circuit includes (a) identifying the storage elements whose last stage clock input buffer can be replaced by a gating element, and (b) generating the logic for the enable signal of each gating element. It is a requirement to ensure that any suppression of clock activity (or equivalently de-assertion of the enable signal) does not change the functionality of the digital circuit. One clock-gating technique that satisfies this requirement is to identify the condition under which the inputs to the storage elements are identical to the state values already present in the storage elements. This condition is referred to as the quiescent input state condition (or quiescent condition). Under this condition, clocking the storage elements does not change the state values and hence the corresponding clocks to the storage elements can be suppressed for as long as the quiescent input state condition holds. The quiescent condition of a storage element is induced by signals, involved in generating all the data inputs to the storage element, staying unchanged from the previous clock cycle to the current clock cycle with respect to the clock of the storage element. Therefore, a signal is said to be in a quiescence inducing condition in the current clock cycle of the storage element, when it is unchanged from the previous clock cycle to the current clock cycle.

To illustrate this, consider the circuit (200) in FIG. 2. The Cout clock to the storage elements (202) is a buffered version of the Cin clock at the input to the last stage buffer (201) in the clock network (not shown). In this circuit (200), assume the Select signal to the multiplexer (M) is at a logic value of 1 for clock cycle 1, and is at a logic value of 0 for cycles 2 and 3. Since the Select signal is at a logic value of 0, the state value stored in the storage element (202) is fed back as its input (203) via input 0 of the multiplexer (M) in cycles 2 and 3. It is observed that, for clock cycles 2 and 3, the inputs (203) to the storage elements are identical to their stored state values. This satisfies the quiescent condition described above, and hence provides the opportunity to clock-gate these storage elements (202). The signal (203) is said to be in quiescence inducing condition in clock cycles 2 and 3 for the storage element (202).

As shown in FIG. 3, a corresponding clock-gated design (300) is essentially the same as the circuit (200) of FIG. 2 except that a gating element (301) is used to replace the last stage buffer (201) in the circuit (200). The Select signal used in multiplexer (M) can directly be used as the enable signal (denoted as Select (Enable) in FIG. 3) for the clock gating element (301). Note that when the enable signal is asserted high in cycle 1, the Cout clock follows the Cin clock and the storage element (202) is clocked. However in cycles 2 and 3, the clock transitions to the storage element (202) are suppressed. In this example, the quiescent condition of the storage element (202) and the quiescence inducing condition of the signal (203) to enable clock gating may be identified by analyzing the feedback structure of logic around the storage elements (202).

Another quiescent input state condition is illustrated in FIGS. 4 and 5. As shown in FIG. 4, the storage element (A) (register A) is clock-gated with clock gating element (401) which uses the enable signal ENa and clock Cin to derive CoutA as the clock input to the storage element (A). However, the clock CoutB to storage element (B) (register B) is driven by a last stage clock buffer (402) with input Cin.

Example signal waveforms for ENa and Cin and the corresponding behavior of the CoutA and CoutB clocks are shown in FIG. 5. Although Cin and CoutB toggle in all six cycles 1-6, CoutA only toggles for those clock cycles in which ENa is at a logic value of 1, and stays at 0 when ENa is at a logic value of 0. In cycle 2, register A does not get clocked since CoutA is at 0 while register B captures the data value at its input (403). In cycle 3, the input (403) to register B has not changed, since in the previous clock cycle (cycle 2) register A did not get clocked. The signal (403) is said to be in a quiescence inducing condition for register B in cycle 3. Here, cycles 2 and 3 are referred to as the previous and current clock cycles respectively, of the quiescence inducing condition. At the same time in cycle 3, register B satisfies the quiescent input condition since its input is identical to the state value in its storage elements. Hence, the clock CoutB can be suppressed in cycle 3 without changing the functionality of the design.

As shown in FIG. 6A, a corresponding clock-gated design (600) is essentially the same as the circuit (400) of FIG. 4 except that a gating element (601) is used to replace the last stage buffer (402) in the circuit (400). The observation described with respect to FIG. 4 can be generalized to state that the clock CoutB can be suppressed for every clock cycle immediately after a clock cycle in which clock CoutA is suppressed. The enable signal ENb for the gating element (601) used to generate CoutB is generated by delaying ENa by a single clock cycle of Cin. This is accomplished by using a single storage element (C) that is clocked by a buffered version of Cin as shown in FIG. 6. Throughout this document, a first signal is said to be coupled to a second signal if the first signal is a buffered version or an inverted version of the second signal.

Example signal waveforms for both enable signals ENa and ENb and the corresponding clock signals Cin, CoutA, and CoutB are shown in FIG. 6B. Note that CoutB toggles one cycle later for every clock cycle in which CoutA toggles.

The use of feedback analysis (as illustrated in FIGS. 2 and 3) and simple pipelined structures (as illustrated in FIGS. 4-6B) represent two ways to take advantage of the quiescent input state condition to clock-gate storage elements. Besides the requirement to ensure functionality is unchanged, any method to clock-gate a digital circuit must ensure the overall area penalty is minimized. There are two contributors to the area penalty in clock-gating a digital circuit: (i) the area increase when replacing the last stage buffer of the clock network with a clock gating element, and (b) the additional area of the logic created for the enable signals to the gating elements.

To address the area penalty, storage elements are typically not individually clock-gated. As shown in FIG. 6A, register B may represent a set of storage elements where signal (403) may represent signals of an input bus. One skilled in the art will recognize that the set of storage elements in register B may be combined into a single clock-gating group. This enables sharing of both the clock-gating element (601) and the additional logic used to create the enable signal ENb, thus reducing the area penalty compared to clock gating each individual storage element separately. Although the typical size of clock-gating groups can vary for different storage elements in a circuit, a rule-of-thumb used in prior art is to achieve an average clock-gating group size of 16 for the entire circuit.

Methods described above in using the quiescent input condition to clock-gate a circuit are limited. For example, feedback analysis requires the circuit to have storage elements with feedback logic structures. Such feedback structures are absent or used sparsely in certain classes of digital circuits such as those used in networking and data-flow intensive applications. Similarly many circuits do not conform to the simple pipelined topology shown in FIG. 4. The presence (not shown) of multiple registers that source data (403) (instead of a single register (A) as in FIG. 4) or more complex combinational logic between pipeline stages (instead of a single buffer (403) as in FIG. 4) limits the applicability of simple pipelined analysis to clock-gate the destination registers as illustrated in FIGS. 4-6B.

It would therefore be desirable to have a method to clock-gate a digital circuit without solely relying on feedback analysis or simple pipelined structures. Such a method would enable a plurality of storage elements in the circuit to be clock-gated leading to a greater reduction in the total dynamic power of the design. The method should also guarantee that the functionality of the design is unchanged; reduce the area penalty by constructing the enables using minimal number of signals; and allow storage elements to be grouped into reasonable sized clock-gating groups prior to replacing the last stage buffer in the clock network with a clock-gating element.

SUMMARY

In general, in one aspect, the invention relates to a device including a first storage element and a first clock gating element, wherein a data input of the first storage element is coupled to an output of a combinatorial logic (CL) element, wherein the first storage element is clock-gated with the first clock gating element using a first clock enable signal to generate a clock signal for the first storage element, wherein the output of the CL element is exclusively sensitized from at least one data input of the CL element by at least one control input of the CL element when each of the at least one control input of the CL element is in a first quiescence inducing condition with respect to the clock signal, wherein each of the at least one control input of the CL element does not change state between previous and current clock periods in the first quiescence inducing condition, wherein the first clock enable signal is generated, using the at least one data input of the CL element, the at least one control input of the CL element, and the clock signal, to suppress the clock signal in the first clock gating element when each of the at least one data input of the CL element is in a second quiescence inducing condition with respect to the clock signal at the same time as when each of the at least one control input of the CL element is in the first quiescence inducing condition, wherein each of the at least one data input of the CL element does not change state from the previous clock period to the current clock period in the second quiescence inducing condition.

In general, in one aspect, the invention relates to a computer readable medium storing a representation of a circuit. The representation includes a first portion representing a first storage element and a first clock gating element in the circuit, wherein a data input of the first storage element is coupled to an output of a combinatorial logic (CL) element in the circuit, wherein the first storage element is clock-gated with the first clock gating element using a first clock enable signal to generate a clock signal for the first storage element and a second portion representing the CL element in the circuit, wherein the output of the CL element is exclusively sensitized from at least one data input of the CL element by at least one control input of the CL element when each of the at least one control input of the CL element is in a first quiescence inducing condition with respect to the clock signal, wherein each of the at least one control input of the CL element does not change state between previous and current clock periods in the first quiescence inducing condition, wherein the first clock gating element is configured to generate the first clock enable signal, using the at least one data input of the CL element, the at least one control input of the CL element, and the clock signal, to suppress the clock signal in the first clock gating element when each of the at least one data input of the CL element is in a second quiescence inducing condition with respect to the clock signal at the same time as when each of the at least one control input of the CL element is in the first quiescence inducing condition, wherein each of the at least one data input of the CL element does not change state from the previous clock period to the current clock period in the second quiescence inducing condition.

In general, in one aspect, the invention relates to a method to clock-gate a circuit. The method includes identifying a first storage element and a combinatorial logic (CL) element in the circuit, wherein the first storage element is clocked by a clock signal, wherein a data input of the first storage element is coupled to an output of the CL element in the circuit, identifying a first quiescence inducing condition of at least one control input of the CL element with respect to the clock signal, wherein each of the at least one control input of the CL element does not change state between previous and current clock periods in the first quiescence inducing condition, wherein the output of the CL element is exclusively sensitized from at least one data input of the CL element by the at least one control input of the CL element when each of the at least one control input of the CL element is in the first quiescence inducing condition, identifying a second quiescence inducing condition of the at least one data input of the CL element with respect to the clock signal, wherein each of the at least one data input of the CL element does not change state between previous and current clock periods in the second quiescence inducing condition, providing a first clock gating element, wherein the first storage element is clock-gated with the first clock gating element using a first clock enable signal to generate a clock signal for the first storage element, wherein the first clock gating element is configured to generate the first clock enable signal, using the at least one data input of the CL element, the at least one control input of the CL element, and the clock signal, to suppress the clock signal in the first clock gating element when each of the at least one data input of the CL element is in the second quiescence inducing condition at the same time as when each of the at least one control input of the CL element is in the first quiescence inducing condition.

In general, in one aspect, the invention relates to a computer readable medium storing instructions when executed by a processor including functionalities for identifying a first storage element in the circuit, wherein the first storage element is clocked by a clock signal, wherein a data input of the first storage element is coupled to an output of a combinatorial logic (CL) element in the circuit, identifying a first quiescence inducing condition of the at least one control input of the CL element with respect to the clock signal, wherein each of the at least one control input of the CL element does not change state between previous and current clock periods in the first quiescence inducing condition, wherein the output of the CL element is exclusively sensitized from at least one data input of the CL element by the at least one control input of the CL element when each of the at least one control input of the CL element is in the first quiescence inducing condition, identifying a second quiescence inducing condition of at least one data input of the CL element with respect to the clock signal, wherein each of the at least one data input of the CL element does not change state between previous and current clock periods in the second quiescence inducing condition, providing a first clock gating element, wherein the first storage element is clock-gated with the first clock gating element using a first clock enable signal to generate a clock signal for the first storage element; and wherein the first clock gating element is configured to generate the first clock enable signal, using the at least one data input of the CL element, the at least one control input of the CL element, and the clock signal, to suppress the clock signal in the first clock gating element when each of the at least one data input of the CL element is in the second quiescence inducing condition at the same time as when each of the at least one control input of the CL element is in the first quiescence inducing condition.

Other aspects and advantages of the invention will be apparent from the following description and the appended claims.

BRIEF DESCRIPTION OF DRAWINGS

FIGS. 8, 10, 12-22 show example schematic block diagrams according to aspects of the invention.

FIGS. 9 and 11 show example signal waveform diagrams according to aspects of the invention.

DETAILED DESCRIPTION

Figure 1:
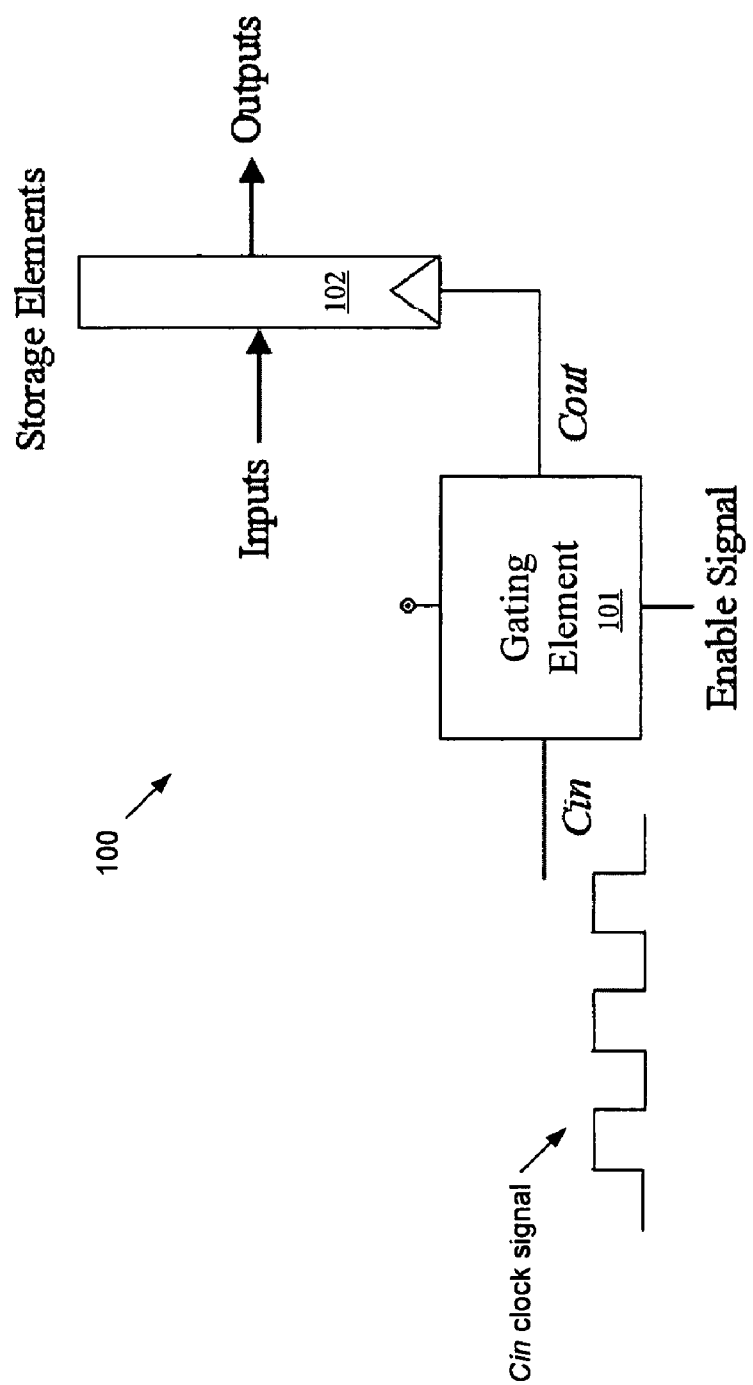
FIGS. 1-4 and 6A show example schematic block diagrams illustrating circuit topologies in which clock gating may be implemented.
Figure 3:
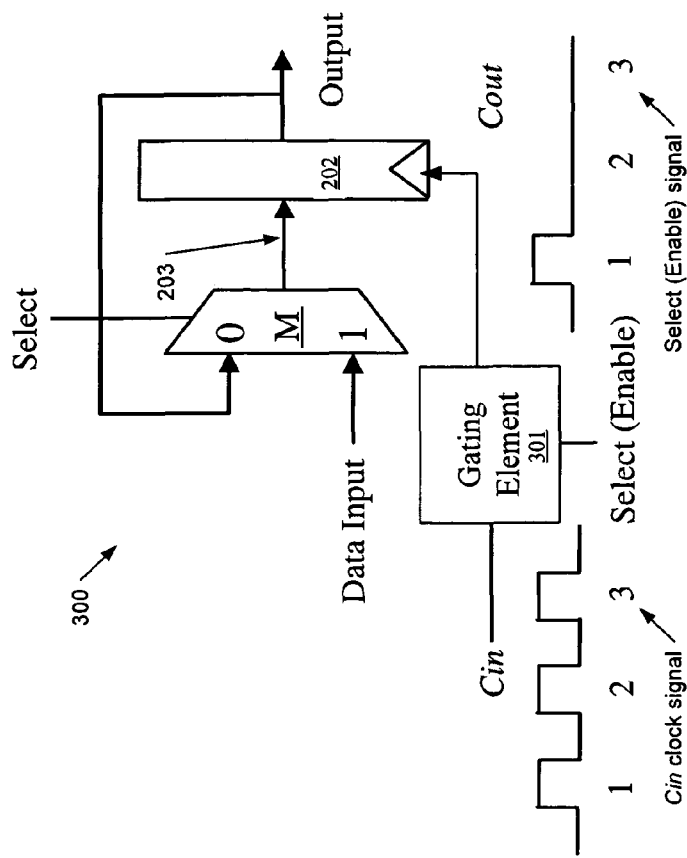
Figure 2:
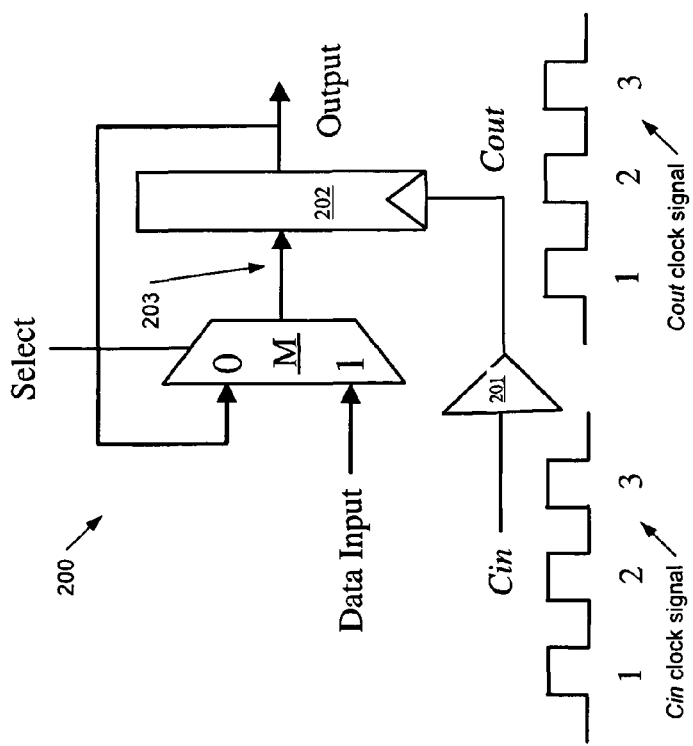
Figures 4, 5:
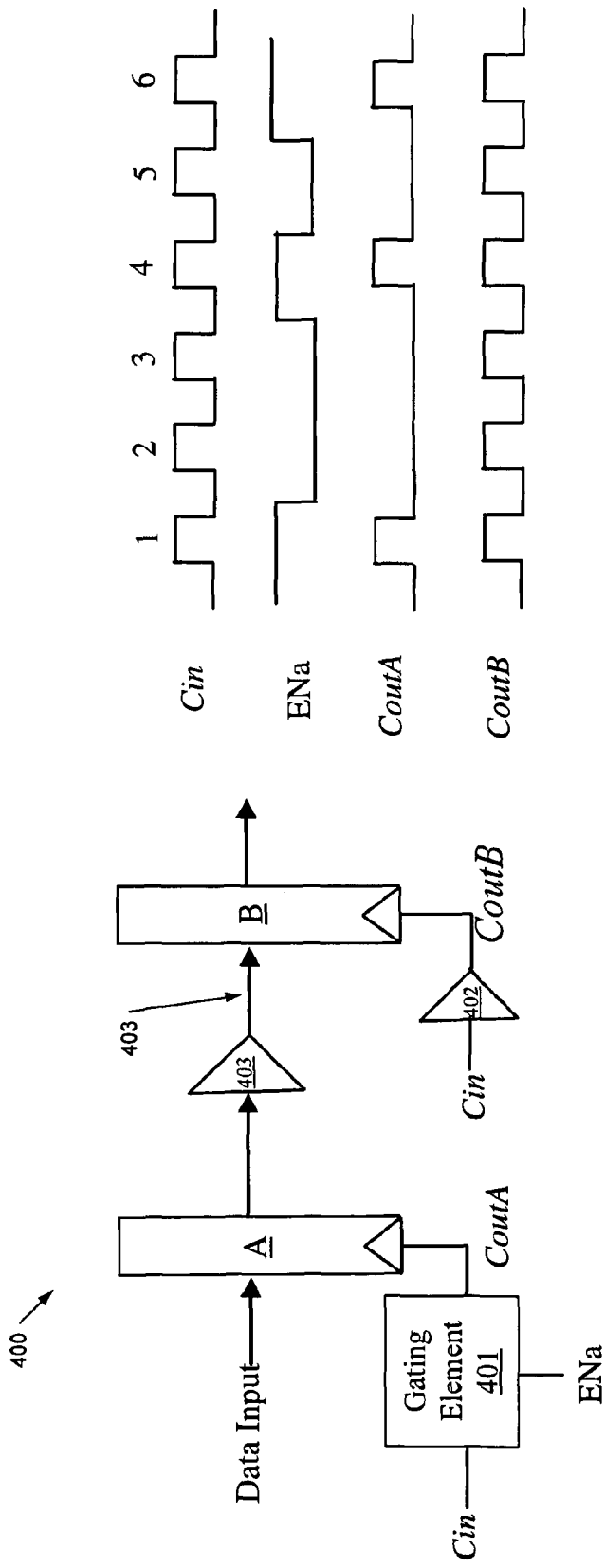
FIGS. 5 and 6B show example signal waveform diagrams illustrating the clock-gating and quiescent conditions.
Figures 6A, 6B:
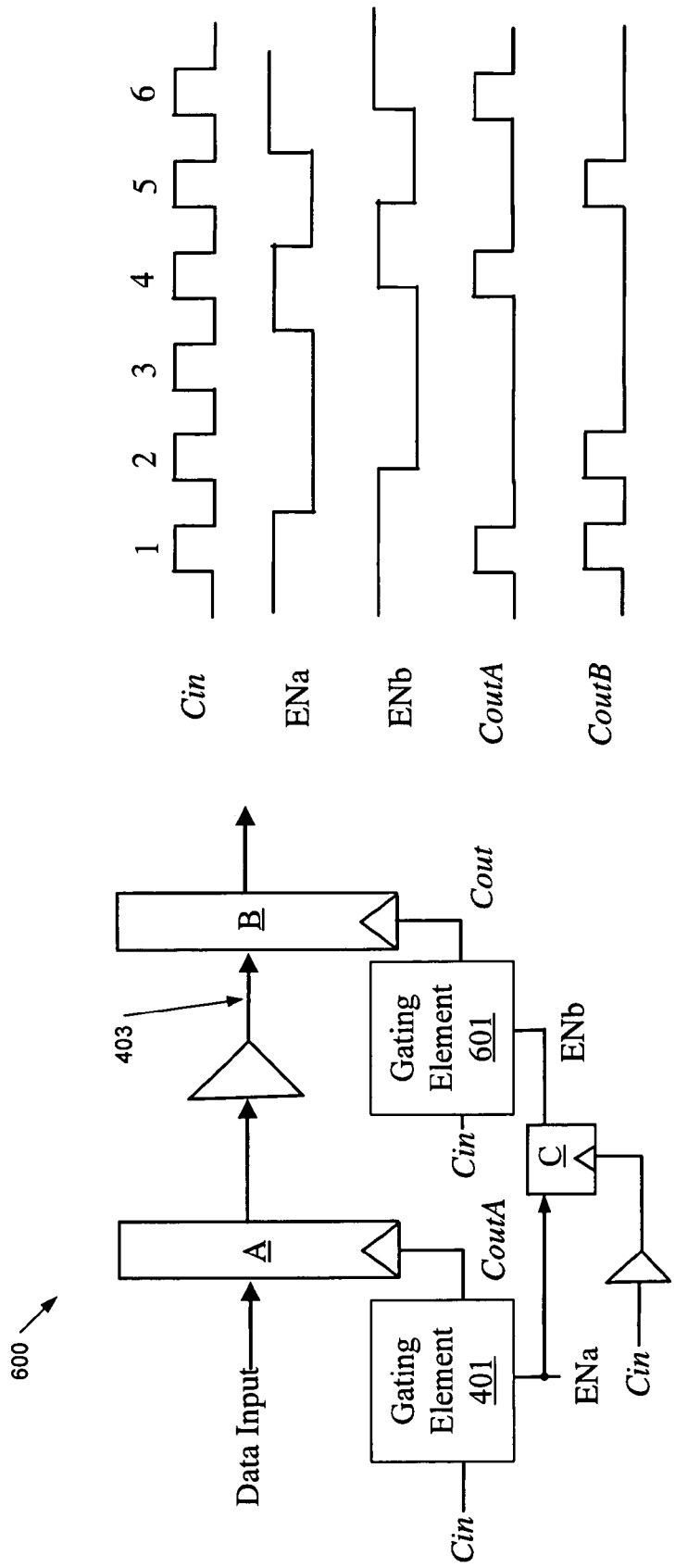

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. In other instances, well-known features have not been described in detail to avoid obscuring the invention.

The present invention provides a method and apparatus to increase the number of storage elements that are clock-gated in a digital integrated circuit. By clock gating these storage elements, a percentage of clocks to these storage elements are suppressed, leading to a reduction in total clock activity. This reduction in clock activity in turn can result in significant savings in the dynamic power consumed by the circuit. Generally speaking, the method ensures that functionality of the circuit is unchanged, and minimizes the area penalty of replacing last-stage clock buffers with clock gating elements by grouping storage elements into reasonable sized clock-gating groups. In addition, tradeoffs may be made between the area penalty of the logic used to generate the clock-gating enable signals, and the efficiency of clock gating (or equivalently the percentage of clocks suppressed at the clock gating elements).

In one or more embodiments of the invention, the method is based on identifying quiescence inducing conditions of signals involved in generating the inputs to a storage element. In one or more embodiments of the invention, feed-forward logic analysis is used to clock-gate storage elements in a digital circuit.

In one embodiment of the invention, circuit topologies in which a group of storage elements is fed by a multiplexer are analyzed to clock-gate the storage elements. For example, control signals that determine if the data inputs to the multiplexer have changed are combined with the associated select signal of the multiplexer to generate the clock-gating enables. By reusing this process for each select of the multiplexer, more clock gating efficiencies may be realized at the expense of an increased area penalty for the enable generation logic.

In one embodiment, a control signal (such as a valid signal or a request/acknowledge signal) that qualifies a data bus prior to the bus getting latched into a set of storage elements is used to generate the clock-gating enables.

In one embodiment, a minimal set of control signals that specify a data transformation (such as data encoders or decoders) is used to clock-gate the storage elements that capture the resultant transformed data.

In one embodiment, a sensitized path to the inputs of a set of storage elements may be used to generate clock enables for the storage elements. If a certain number of control signals both sensitize the path and fully determine the state of the inputs, enables can be generated for the storage elements using feed-forward quiescent input analysis.

In one embodiment of the invention, quiescent input analysis of one or more storage elements in binary counters is used to generate clock enables for the respective storage elements. In clock-gating the storage elements in such counters, tradeoffs are provided between the area overhead of the enable logic and the corresponding clock gating efficiencies.

Various embodiments of this invention may be combined and/or performed individually to clock-gate storage elements in a circuit.

Figure 7:
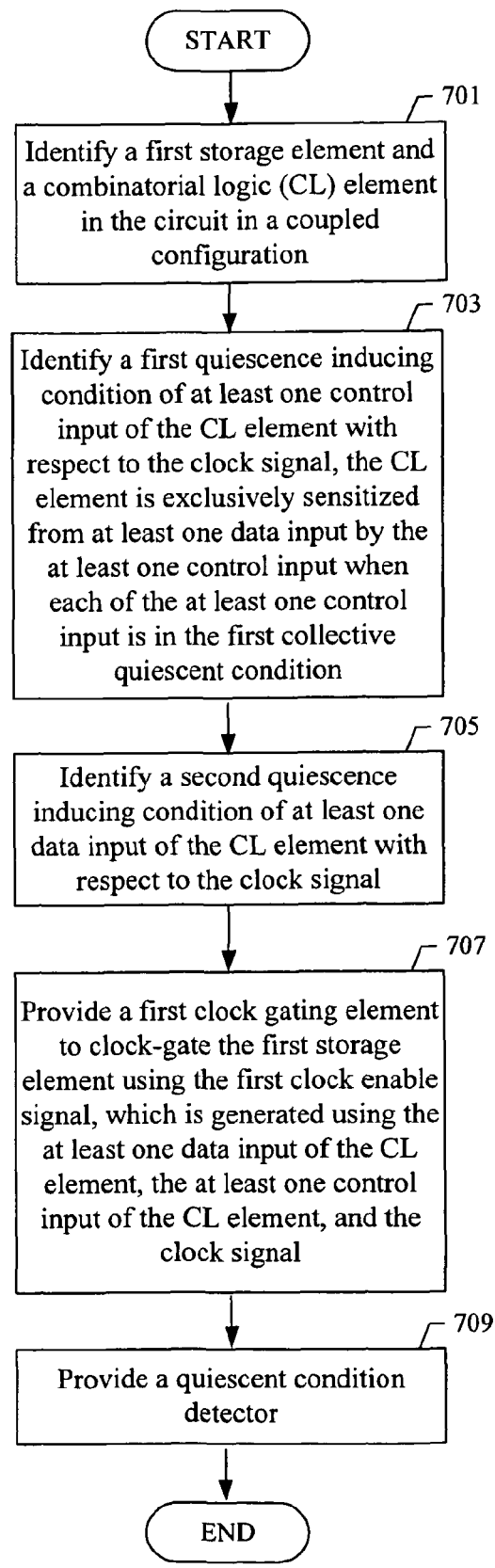
FIG. 7 shows an example method flow chart according to aspects of the invention.

FIG. 7 shows a flow chart of a method to clock-gate a circuit by using feed-forward quiescent input analysis. Here, the terms "circuit," "circuit element" (e.g., storage element, combinatorial logic element, clock gating element, etc.), "signal", "input", "output," etc. may refer, interchangeably, to a physical circuit, circuit element, signal, input, output, etc. or a machine readable representation (e.g., a design description using various structural or behavior design description languages, a circuit netlist of the physical circuit, or other circuit representation data created in circuit design, verification, and manufacturing workflows, etc.) of the physical circuit, circuit element, signal, input, output, etc. Examples of design description languages include HDL (hardware design language), VHDL (VHSIC hardware design language), RTL (register transfer level) languages such as Verilog, etc.

Initially in Step 701, a first storage element and a combinatorial logic (CL) element is identified in the circuit such that the first storage element is clocked by a clock signal and that a data input of the first storage element is coupled to an output of the combinatorial logic (CL) element in the circuit. The CL element includes at least one data input and at least one control input for generating an output signal feeding the data input of the first storage element.

In one or more embodiments of the invention, the identification of the first storage element and the CL element may be performed by analyzing a design description or a netlist of the circuit.

In Step 703, a first quiescence inducing condition of the at least one control input of the CL element with respect to the clock signal is identified.

By definition, in the first quiescence inducing condition, each of the at least one control input of the CL element does not change state from a previous clock period to a current clock period of the clock signal. Said in other words, each of the at least one control input of the CL element does not change state between previous and current clock periods of the first quiescence inducing condition.

In addition, the first quiescence inducing condition is identified such that the output of the CL element is exclusively sensitized from at least one data input of the CL element by the at least one control input of the CL element when each of the at least one control input of the CL element is in the first quiescence inducing condition.

Here, the condition that "the output of the CL element is exclusively sensitized from at least one data input of the CL element by the at least one control input of the CL element" means the condition that the output of the CL element is exclusively determined from the at least one data input of the CL element and that such condition is a result of the at least one control input of the CL element qualifying the at least one data input of the CL element based on the logic function of the CL element.

Specifically, the first quiescence inducing condition is identified by identifying (a) the particular clock cycle and (b) the particular state of the at least one control input of the CL element such that (i) the state of the at least one control input of the CL element stays unchanged from a preceding clock cycle to the particular clock cycle and that (ii) the data input of the first storage element is determined exclusively from the at least one data input of the CL element in the particular clock cycle based on the state of the at least one control input of the CL element.

Said in other words, when the at least one control input of the CL element is in the first quiescence inducing condition, the data input of the first storage element is exclusively determined from the at least one data input of the CL element.

In one or more embodiments of the invention, the identification of the first quiescence inducing condition may be performed by analyzing a design description or a netlist of the circuit.

In Step 705, a second quiescence inducing condition of the at least one data input of the CL element with respect to the clock signal is identified. By definition, in the second quiescence inducing condition, each of the at least one data input of the CL element does not change state between previous and current clock periods of the second quiescence inducing condition. Specifically, the second quiescence inducing condition is identified by identifying (a) the particular clock cycle and (b) the particular state of the at least one data input of the CL element such that (i) the state of the at least one data input of the CL element stays unchanged from a preceding clock cycle to the particular clock cycle. In one or more embodiments of the invention, the identification of the second quiescence inducing condition may be performed by analyzing a design description or a netlist of the circuit. In one or more embodiments of the invention, the identification of the second quiescence inducing condition may be by default if a null or constant data input is identified by analyzing the design description or netlist of the circuit, as they are always by definition in a quiescence inducing condition. More details regarding the null or constant data input are described with respect to FIGS. 13 and 14 below.

In Step 707, a first clock-gating element is provided such that the first storage element is clock-gated using a first clock enable signal to generate a clock signal to the first storage element. Said in other words, the original signal driving the clock input of the first storage element is substituted with a clock signal derived from the first clock enable signal, and is generated by the first clock-gating element, which, for example, may be synthesized as described in detail in Step 709.

In Step 707, the first clock enable signal is generated, using the at least one data input of the CL element, the at least one control input of the CL element, and the clock signal, to suppress the clock signal to the first clock gating element when each of the at least one data input of the CL element is in the second quiescence inducing condition at the same time when each of the at least one control input of the CL element is in the first quiescence inducing condition. Said in other words, the logic function at the first clock gating element, using the data and control inputs of the CL element, is configured to generate the first clock enable signal when both the first and second quiescence inducing conditions are met in the same clock period.

In one or more embodiments of the invention, the first clock-gating element may be provided by modifying or supplementing a design description or a netlist of the circuit.

In Step 709, a quiescent condition detector is provided to detect one or both of the first and second quiescence inducing conditions such that the first storage element may be identified to be in the quiescent input state condition (or the quiescent condition).

In one or more embodiments of the invention, the quiescent condition detector may be configured to compare a signal of the at least one control input of the CL element and the at least one data input of the CL element in the current clock period with the state of the signals in the previous clock period for detecting one or both of the first and second quiescence inducing conditions to generate the first clock enable signal. For example, either a data input signal or a control input signal of the CL element may be compared with a latched version of the signal to compare the state of the signal in the previous and current clock periods for detecting the condition that the signal stays unchanged between previous and current clock periods, which is then identified as the quiescence inducing condition of the signal.

In one or more embodiments of the invention, based on identifying a signal of the at least one control input of the CL element and the at least one data input of the CL element being coupled to an output of a second storage element clock-gated with a second clock gating element using a second clock enable signal to generate the clock signal for the second storage element, the quiescent condition detector may be configured to generate the first clock enable signal using the second clock enable signal. For example, either a data input signal or a control input signal of the CL element may be identified as being generated by a second storage element, which is clock-gated using a second clock enable signal. Accordingly, the provided quiescent condition detector may be configured to generate the first clock enable signal using the second clock enable signal.

In one or more embodiments of the invention, the quiescent condition detector may be provided by modifying or supplementing a design description or a netlist of the circuit.

Steps 703-705 described above are referred to as the feed-forward analysis. In one or more embodiments of the invention, Steps 703-705 may be performed by analyzing a representation of the circuit stored on a computer readable medium while Steps 707-709 may be performed to modify or supplement a representation of the circuit stored on the computer readable medium.

Other aspects and additional details of the method depicted in the flow chart of FIG. 7 will be apparent from the following description of examples. In the examples described with respect to FIGS. 8-22, register, multiplexer, various logic gates, etc. are used as implementation examples of the storage element, CL element, quiescent condition detector, etc. Those skilled in the art, with the benefit of this disclosure, will recognize that other implementation examples may also be used without deviating from the spirit of the invention. Furthermore, the example schematic diagrams illustrated in FIGS. 8-22 are based on one of various formats of circuit representation data. Those skilled in the art, with the benefit of this disclosure, will recognize that various circuit elements referred to in this document may be based on other formats of circuit representation data (e.g., HDL, VHDL, netlist, Verilog etc.) without deviating from the spirit of the invention.

Figures 8, 9:
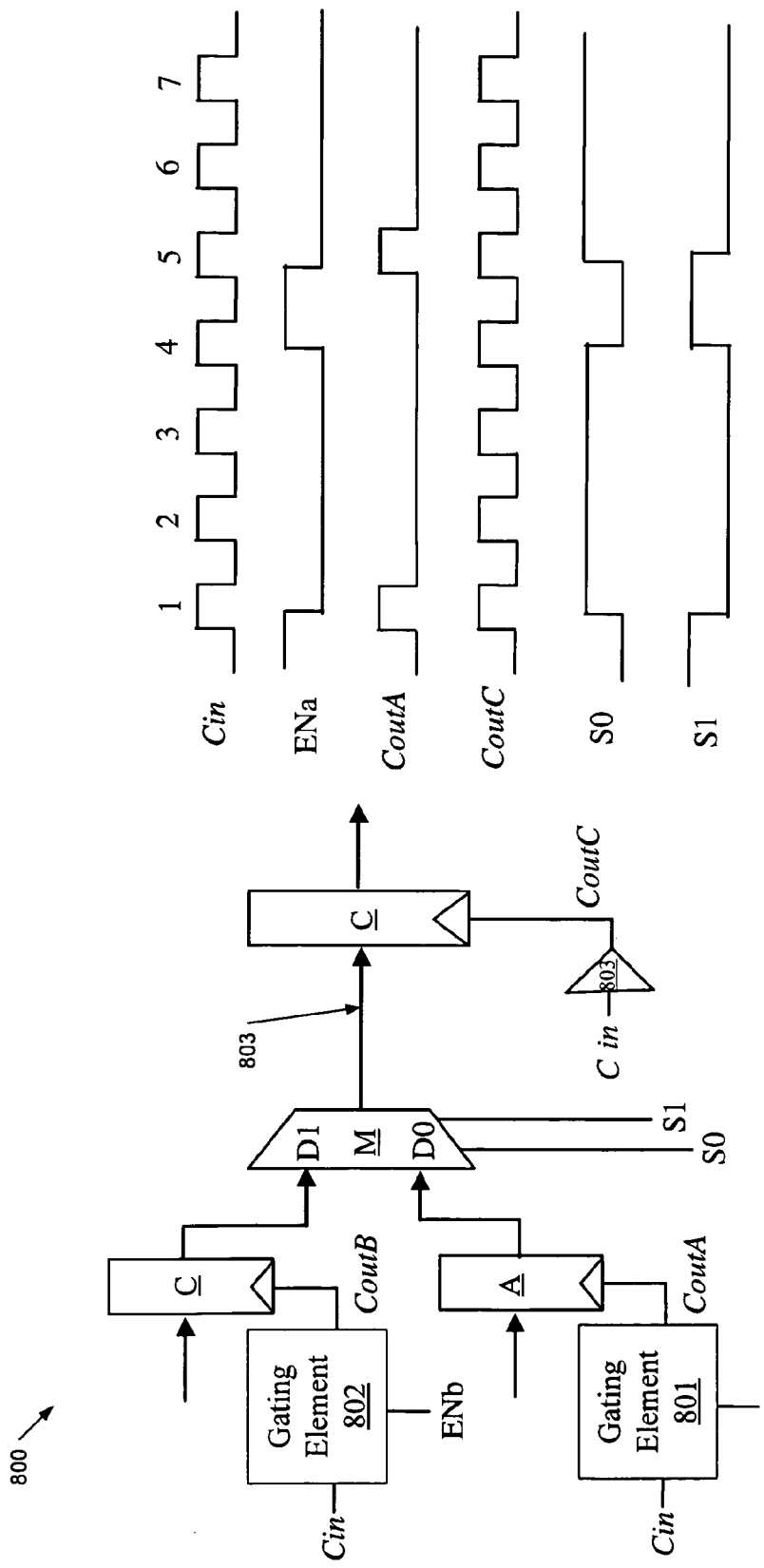

FIG. 8 shows an example schematic diagram of circuit (800) in accordance with one embodiment of the invention where the method of FIG. 7 can be implemented. Here, circuit (800) includes register (A) and register (B) each feeding data to inputs D1 and D0 of the register (C) via a 2-to-1 decoded multiplexer (M) controlled by select signals (or select line, select pin, select port, etc.) S0 and S1. When S0=1, the D0 input is sent to the output (803) of the multiplexer (M), and when S1=1, the D1 input is sent to the output (803) of the multiplexer (M). In general, a decoded n-to-1 multiplexer has n select signals to specify which of the n data inputs to the multiplexer is seen at the output of the multiplexer. The n select signals are such that at any given time only one of them is active. This is referred to as the selects being in a one-active (e.g., one-hot or one-cold) condition. A set of signals $\{s0,s1, s2 \ldots sn\}$ is said to be one-hot when at any given time, one and only one of them can assume a logic value of 1 and the others must assume a logic value of 0. Similarly a set of signals is said to be one-cold when at any given time, one and only one of them can assume a logic value of 0 and the others must assume a logic value of 1. Although a 2-to-1 decoded multiplexer (M) is shown in FIG. 8 as an example of the CL element in the method described in FIG. 7, any n-to-1 multiplexer (n>=2) configuration in various multiplexer design styles may be applicable in using the method without deviating from the spirit of the invention.

As shown in FIG. 8, when the select line S0 is active, the data from register (A) is passed to the output (803) of the multiplexer (M) and hence to the input (803) of register (C), and conversely when select line S1 is active, the data from register (B) is passed to the input (803) of register (C). Registers (A) and (B) are clock-gated with clock gating elements (801) and (802) that use signals ENa and ENb as their enable signals, respectively. Register (C) however is not clock-gated and is driven by a last-stage clock buffer (803) whose input is driven by Cin. Example waveforms for the signals ENa, S0 and S1 and the clocks Cin, CoutA and CoutC are shown in FIG. 9. Note the behavior of select lines S0 and S1 where for any given clock cycle 1-7, one and only one of the select lines is asserted. This satisfies the one-hot condition referred to earlier.

It can be seen in FIG. 8 that conventional use of quiescent input conditions to clock-gate register (C) is not directly applicable. Firstly there are no feedback structures around the register (C). The simple pipelined method also cannot be applied because multiple sources of data specify the inputs to register (C), and specifically the absence of information about when the select lines will change. In one or more embodiments of the invention, the clock gating enables for the two data sources (registers (A) & (B)) may be used to indicate when the data inputs to the multiplexer (M) will change. However for the select lines S0 and S1 of the multiplexer (M), as is typical in various digital circuits, clock-gating the source storage elements generating control signals (such as the select lines) may be difficult and may impose significant area penalty, limiting the general applicability of the simple pipelined method.

In the waveforms shown in FIG. 9, consider the behavior of the circuit (800) in cycle 3. In the previous cycle (cycle 2), the multiplexer (M) was selecting data from register (A) since S0 was at a logic value of 1, and register (A) does not get clocked since ENa was at a logic value of 0. In the current cycle (cycle 3) the multiplexer (M) continues to select data from register (A) since S0 is at a logic value of 1. Hence the quiescent input condition is satisfied at register (C) for cycle 3, that is, the data values at its inputs are identical to the state values in the register, which it had clocked in cycle 2. At the same time, a quiescence inducing condition of the data input D0 is satisfied by definition. Hence it is possible to suppress the clock to register (C) in cycle 3.

Figures 10, 11:
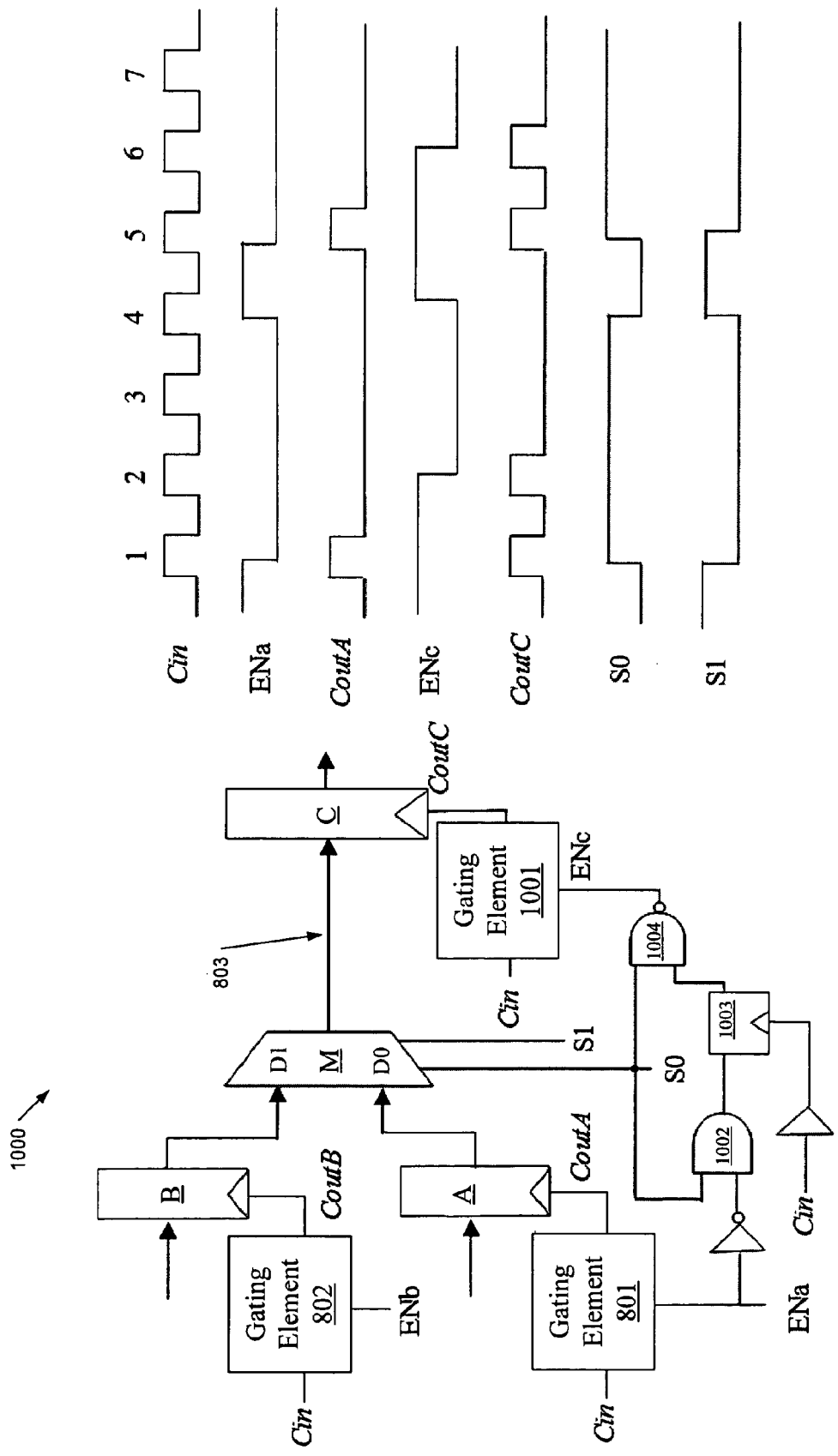

FIG. 10 shows the modified circuit (1000) that is essentially the same as circuit (900) with the exception of the added enable generation logic for register (C) based on feed-forward analysis of the path sensitized by select S0. Specifically, the select signal S0 and the inverted signal of the enable ENa to the clock gating element (801) of register (A) are combined via an AND gate (1002) and latched into a single storage element (1003). If the output of this storage element (1003) is a 1, it will indicate that in the previous cycle both the select line S0 was at a logic value of 1, and the ENa signal was at a logic value of 0. The output of the storage element (1003) is then combined with the select line S0 via a NAND gate (1004) and the output of the NAND gate is used as the enable signal ENc for the clock gating element (1001) to register (C).

The output of the NAND gate (1004) will ONLY be 0 under the following condition—(a) in the previous cycle, the value of the ENa signal was 0 and the value of the select S0 signal was 1 causing the output of the latch (1003) to be 1 in the current cycle, and (b) in the current cycle, the value of the select S0 signal is 1. This is equivalent to the condition under which the inputs to register (C) are identical to the state values stored in its storage elements, and hence the clock to register C can be suppressed.

In this example, following the description in Step 707 of the method in FIG. 7, it can be seen that conditions (a) and (b) together are also equivalent to (i) a first quiescence inducing condition is identified that at least one control input (S0) of the CL element (i.e., multiplexer (M)) stays unchanged (logic 1) between previous and current clock period, and (ii) a second quiescence inducing condition is identified that at least one data input (D0) of the CL element (i.e., multiplexer (M)) stays unchanged (logic 1) between previous and current clock period (as described with respect to FIG. 9 above). Therefore, NAND gate (1004), storage element (1003), and AND gate (1002) make up the quiescent condition detector referred to in Step 709 of the method in FIG. 7. In addition, the output (803) of the CL element (i.e., multiplexer (M)) is exclusively sensitized from the at least one data input (D0) by the at least one control input (S0) when the at least one control input (S0) is in the first quiescence inducing condition, as described in Step 703 of the method in FIG. 7.

Furthermore, following the description in Step 707 of the method in FIG. 7, it can be seen that the quiescent condition detector described above (a) compares the state of the control signal S0 in the previous and current clock periods, and (b) generates the clock enable signal ENc from the clock enable signal ENa.

Example waveforms are shown in FIG. 11 for the enable signals ENa, ENb, ENc, Cin, CoutA, CoutB, and the new waveform of clock CoutC where it can be seen that the clock CoutC is suppressed in cycles 3, 4, and 7. This leads to a savings of 43% in clock activity. In the original circuit (800), the clock CoutC to register (C) was clocking for 7 cycles, and in the clock-gated circuit (1000), the clock CoutC to register (C) only clocks for 4 cycles. Hence the savings is 3 cycles, or from a percentage perspective ((3/7)*100=) 43% in clock activity for these seven clock cycles of operation.

The foregoing description shows how circuit topologies of one control input S0 of the CL element with the clock gating enable ENa for the corresponding data register (A) sourcing the data input chosen by S0 to the CL element may be analyzed to generate a clock gating enable for register (C). To further improve the clock gating efficiency (or percentage of clocks suppressed) at register (C), a similar process can be used for each of the control inputs of the CL element (e.g., select lines of the multiplexer (M)) and the clock gating enable of the corresponding register whose output is chosen by the select line. For example, logic similar to the quiescent condition detector with S0 and ENa for register (A) in FIG. 10 may be implemented with the select line S1 and the clock-gating enable ENb for register (B) as illustrated in FIG. 12.

Figure 12:
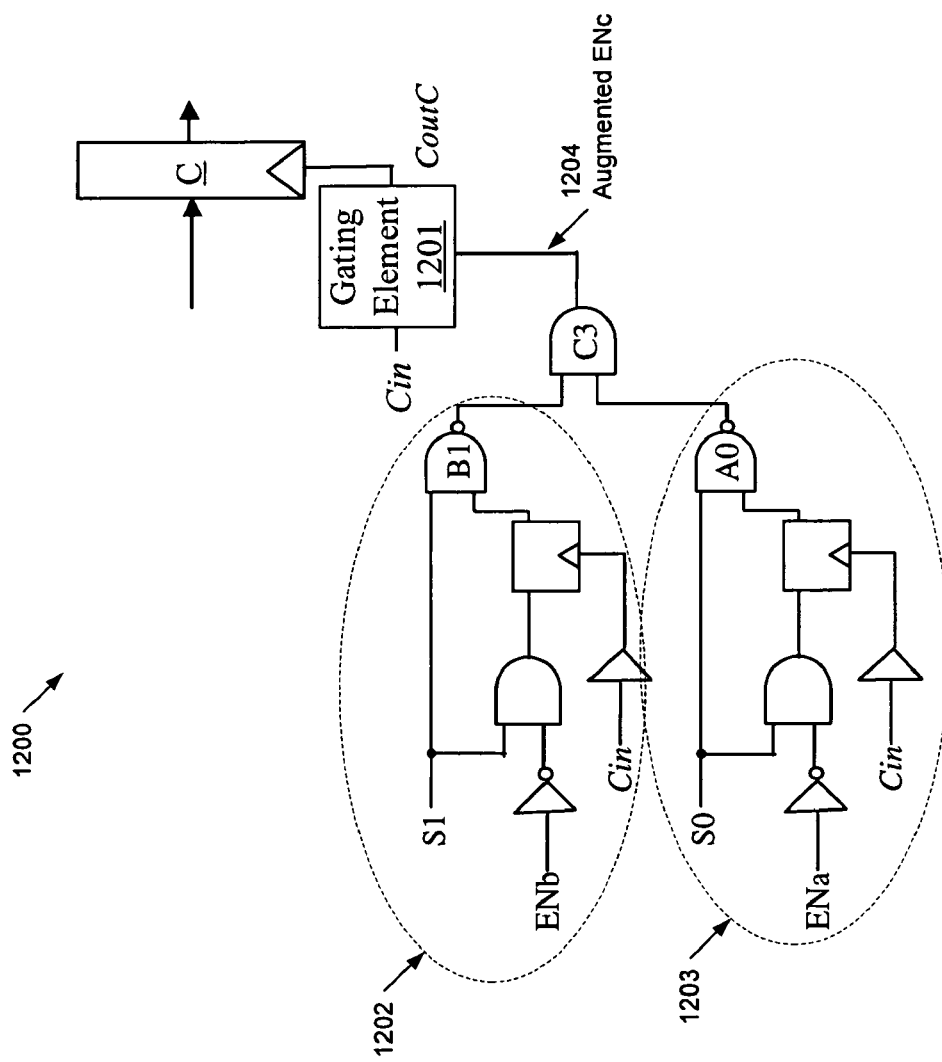

As shown in FIG. 12, the circuit (1200) combines the quiescent condition detector (1202) based on the use of select S1 and enable ENb with the quiescent condition detector (1203) based on the use of select S0 and enable ENa using the AND gate (C3). The functionalities of the quiescent condition detectors (1202) and (1203) are essentially the same as the quiescent condition detector illustrated in FIGS. 10 and 11. For clarity, only the relevant signals and logic gates involved in the generation of the augmented enable ENc (1204) for register (C) are shown in FIG. 12 where registers (A and B) and CL element (M) shown in FIGS. 8 and 10 are omitted. As discussed earlier, when the output of the NAND gate (A0) is 0, it indicates that in the previous clock cycle enable S0 was 1 and ENa was 0, and in the current clock cycle S0 is 1. In addition, the select line S0 is sensitizing the input D0 of the CL element (M) as data to the input of register (C) and this data is identical to the content of the storage elements of register (C). Hence the clock in the current clock cycle to register (C) can be suppressed.

Similarly when the output of the NAND gate (B1) is 0, it indicates that in the previous clock cycle select S1 was 1 and ENb was 0, and in the current clock cycle select S1 is at a logic value of 1. In addition, the input D1 of the CL element (M) is sensitized by select S1 as the input to register (C) and this data is identical to the state values in register (C). Hence the clock can be suppressed in the current cycle. Note that for any given clock cycle, the outputs of the NAND gates (A0) and (B1) can both be at a logic value of 1, or at most one of them can be at a logic value of 0. The AND gate (C3) outputs a logic value of 0 when either of the NAND gates (A0) or (B1) outputs a logic value of 0. Since the output of AND gate (C3) is the enable signal ENc for register (C), this allows the clock to be suppressed under either of the two conditions described above.

The increased clock gating efficiency in using both select lines S0 and S1 and the respective clock enables of the registers they select, does come at the expense of increased area penalty. Those skilled in the art, with the benefit of this disclosure, will be able to make appropriate tradeoffs between clock gating efficiency (and the associated decrease in dynamic power consumption) and the increased area penalty. In one or more embodiments of the invention, the tradeoff between clock gating efficiency and the increased area penalty may be made by ranking the select lines of a multiplexer in terms of the probability of each select line being asserted in typical circuit operation. The higher the probability of the select line being asserted, the more opportunity exists to satisfy the quiescent input condition identified using the feed-forward analysis described above, thus resulting in suppression of the associated clocks. In this way, one can efficiently tradeoff the clock gating efficiency by incrementally adding more select lines to the enable generation logic (i.e., the quiescent condition detector) while considering the additional area penalty it imposes on the design.

In another example, the method of FIG. 7 (e.g., the feed-forward quiescent input analysis) may be used in circuits that make use of control signals to qualify a set of unified data signals (also referred to as a data bus) prior to getting latched into a set of storage elements. For example, in various processor and networking circuits, a valid control signal is often used to indicate whether or not the set of logic values in a data bus is to be used.

In FIGS. 13 and 14, each of the circuits (1300) and (1400) is shown to include the CL element (1304) or (1404) and a storage element (C) (register C) where a control signal Valid is used to qualify a data bus (the output of the logic (1305) or (1405)) to generate multi-bit inputs (1303) or (1403), respectively, to the storage element (C). Storage element (A) represents another portion of the circuits (1300) and (1400). In FIG. 13, each signal in the data bus is ANDed with the Valid signal prior to getting latched into the corresponding bit of register C. As a result, when the Valid signal is at a logic value of 1, the data from the data bus output from the logic (1305) is passed unchanged into register (C). Conversely when the Valid signal is at a logic value of 0, all storage elements in register (C) capture a logic value of 0 independent of any other inputs to the CL element (1304). In this condition following the method of FIG. 7, the output (1303) of the CL element (1304) is said to be exclusively sensitized from a null or constant data input by the at least one control input (Valid signal) of the CL element (1304). By definition, the null or constant data input is always in a quiescence inducing condition. Similar functionality with respect to the qualification of data with the Valid signal is implemented using multiplexer (M) in FIG. 14. By use of a 2-to 1 encoded multiplexer (M), the output of the multiplexer (M) is identical to the data input D1 when Valid is 1, and forced to all 0's when Valid is 0.

Figures 15, 16:
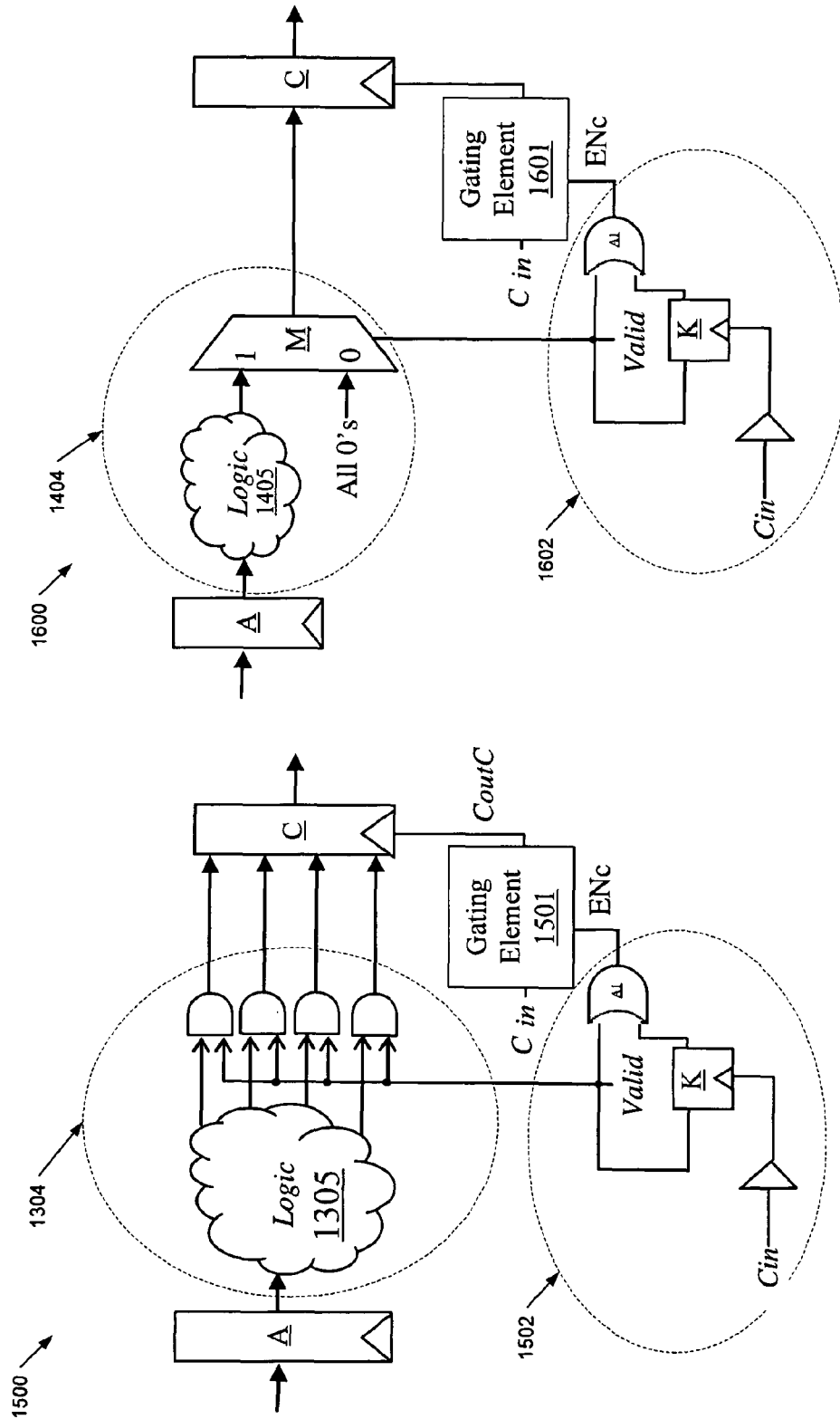

In FIGS. 15 and 16, circuits (1500) and (1600) are clock-gated versions of essentially the same circuits (1300) and (1400) in FIGS. 13 and 14, respectively. Storage element (A) represents another portion of circuits (1300) and (1400). In both cases, the Valid signal is latched into a single storage element (K) driven by a buffered version of Cin. The output of the OR gate (A1) is used as the clock-gating enable ENc for the gating element (1401) or (1501) of register (C). The storage element (K) and the OR gate (A1) form the quiescent condition detector (1502) and (1602) for circuits (1500) and (1600), respectively. The ENc enable signal will be at a logic value of 0 ONLY under the following condition (a) in the previous clock cycle, the Valid signal was at a logic value of 0, and (b) in the current clock cycle the Valid signal is at a logic value of 0. Based on this condition and the circuit topologies described above that follow the method in FIG. 7, the quiescent condition detectors (1502) and (1602) are configured to compare a signal of the at least one control input (Valid signal) of the CL element (1304) or (1404) in the current clock period with the state of the signal (Valid signal) in the previous clock period. In addition, as described above, it is identified from the topology of the CL element (1304) or (1404) that the output of the CL element is exclusively sensitized by the null or constant data input, which is always in a quiescence inducing condition. Under this condition, all the inputs to register (C) will be at a logic value of 0, and this will be identical to the contents of register (C) (since it would have latched in all 0 logic values in the previous cycle). Hence the clock to register (C) in the current cycle can be suppressed.

Those skilled in the art will recognize the example circuits (1300)-(1600) may be used in various digital circuit applications. For example, in the use of arbiters or request-acknowledge protocols, a request control signal or acknowledge control signal is often sent along with the relevant data or address bus between the agents involved in the protocol. In that scenario, the request or acknowledge control signal plays the role of the Valid signal for the associated data bus as shown in FIGS. 13-16. Other variations may also exist in how the data may be qualified with the associated control signal based on circuit design. Although AND gates and a 2-to 1 encoded multiplexer are used in the example circuits (1300)-(1600), other types of gates and circuit structures may also be used to qualify the data with the associated control signal without deviating from the spirit of the invention.

Figures 17, 18:
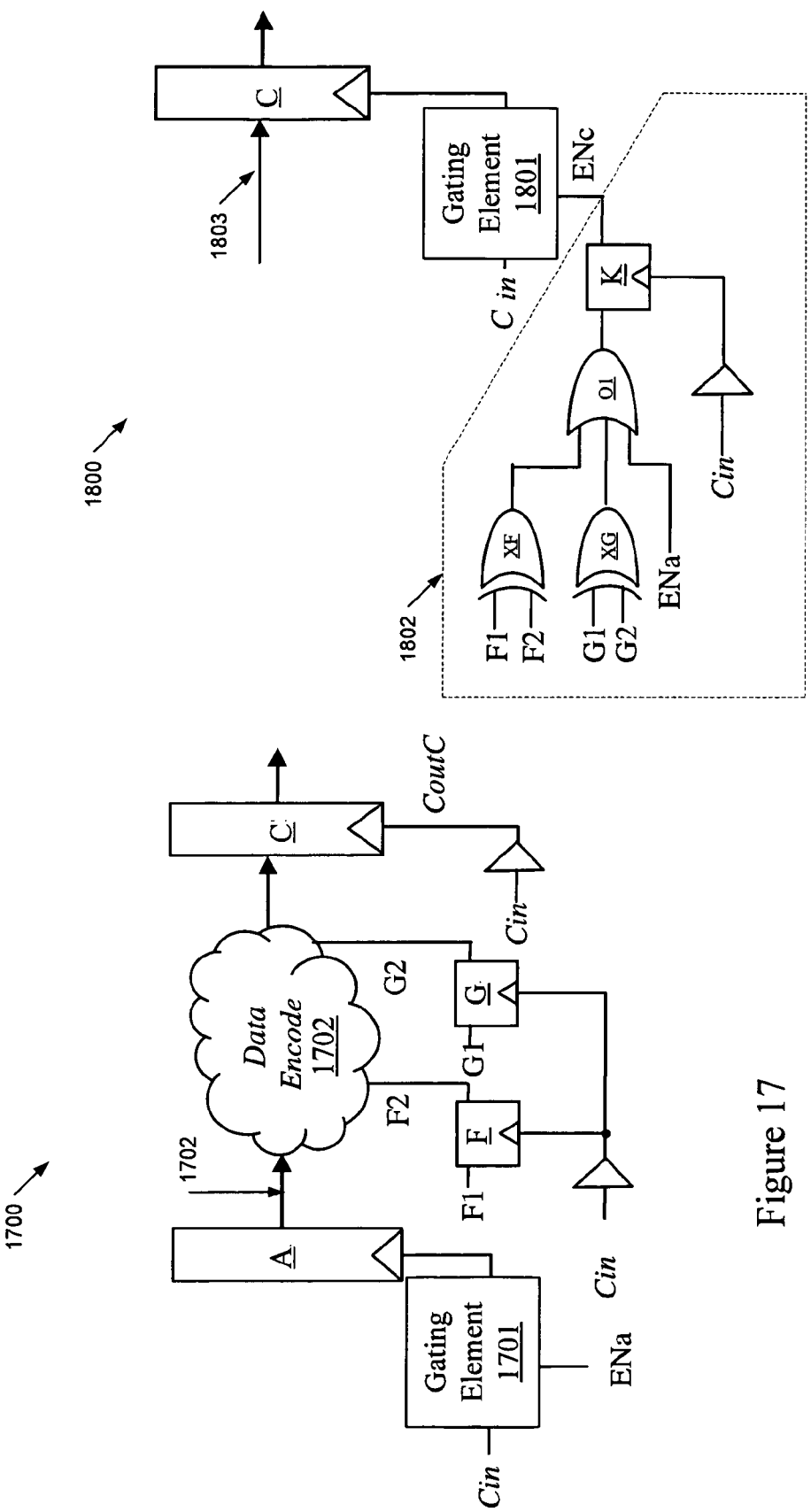

FIG. 17 shows another example circuit (1700) including register (A) with a clock-gating element (1701) whose enable signal is ENa. As shown in FIG. 17, the output data from register (A) is modified with a data encoder circuit (1702) prior to getting latched into a register (C) consisting of multiple storage elements. A data encoder circuit (1702) may be any circuit that transforms data based on pre-determined requirements such as a specific computation to be done on the data. In the circuit (1700), the data encoder (1702) makes use of two control signals F2 and G2 to specify the transformation. For example, the transformation may leave the data unchanged, inverted, set to the all-0 value, or converted to the twos-complement of the data based on four possible logic settings selected by the two inputs F2 and G2.

Further as shown in FIG. 17, the two control signals F2 and G2 of the encoder circuit (1702) are sourced from two storage elements (F) and (G) whose data inputs are F1 and G1, respectively. Both the storage elements (F) and (G) are clocked by a buffered version of Cin and, unlike register (A) with clock gating element (1701), are not clock-gated. As described earlier, storage elements that drive control signals are typically difficult to clock-gate and can impose a significant area penalty if they are individually clock-gated. The lack of an enable signal for storage elements (F) and (G) also prevents use of the simple pipelined method to clock-gate register (C).

FIG. 18 shows an example circuit (1800), which is essentially the same as circuit (1700) with the addition of example clock-gating logic for register (C). In one or more embodiments of the invention, feed-forward analysis based on steps 701-705 in FIG. 7 may be applied to the circuit (1700) and circuit synthesis may be performed based on steps 707 and 709 in FIG. 7 to modify the circuit (1700) into the circuit (1800). For clarity, only the relevant signals and logic gates used in generating the enable signal ENc for the clock-gating element (1801) and register (C) are shown in FIG. 18.

As shown in FIG. 18, for each of the control signals F2 and G2, a corresponding XOR gate (XF) or (XG) is used to compare the logic values at the input and output of the corresponding storage element (F) or (G). For example, the output of XOR gate (XF) will be at a logic value 0 if and only if both F1 and F2 are of the same logic value (either both are 1 or both are 0). In one or more embodiments of the invention, this condition may be used to indicate whether F2 changed in the previous cycle or clock period.

The data inputs (1803) to register (C) only depend on the outputs of register (A) (not shown) and the logic values of F2 and G2. As shown in FIG. 18, the output of XOR gate (XF), the output of XOR gate (XG), and the clock-gating enable ENa are used as the inputs to OR gate (O1). The output of OR gate (O1) will only be 0 if (a) the output of register (A) and (b) the outputs of the storage elements (F) and (G) have not changed in the previous cycle. Said in other words, XOR gates (XF) and (XG) are used to detect whether F2 and G2, respectively, changed in the previous cycle.

Considering the condition (a) with respect to the method in FIG. 7, a second storage element (A) and a second clock gating element (1701) is identified in the circuit (1700) where a signal (1702) of the at least one data input of the CL element (1702) is coupled to an output of the second storage element (A) clock-gated with the second clock gating element (1701) using a second clock enable signal (ENa), and the first clock enable signal (ENc) is generated using the second clock enable signal (ENa) in a quiescent condition detector (1802).

Considering the condition (b) with respect to the method in FIG. 7, XOR gates (XF) and (XG) may be used in the quiescent condition detector (1802) to compare a signal of the at least one control input (F2 and G2) of the CL element (1702) in the current clock period with the state of the signal in the previous clock period.

Accordingly, the circuit (1700) may be converted to the circuit (1800) by applying the method of FIG. 7 to the circuit (1700) and latching the output of the OR gate (O1) into a single storage element (K), from which the clock enable ENc for register (C) is generated. The enable ENc will be 0 only if in the previous cycle the signals F2, G2 and ENa did not change—under this condition, the inputs to register (C) will be identical to the contents of its storage elements and hence the clock can be suppressed in the current clock cycle.

As will be apparent to those skilled in the art, the application of the method of FIG. 7 is not restricted to use of a data encoder in the logic between register (A) and register (C) in the example above. Any equivalent logic such as decoders or comparators whose function with respect to data transformation depends on a minimal number of control signals may substitute for the example logic as the CL element of the method in FIG. 7. In the example above, existing storage elements (F) and (G) in the circuit (1700) are used in detecting the quiescence inducing condition of F2 and G2. In other examples, access to the inputs of storage elements generating control inputs to the CL element may not be readily available, for example because the storage elements may be physically located in a different circuit block, or that intervening logic may exist between such storage elements and the control inputs of the CL element, in which case the quiescent condition detector may be implemented differently than that in FIG. 18.

Figure 19:
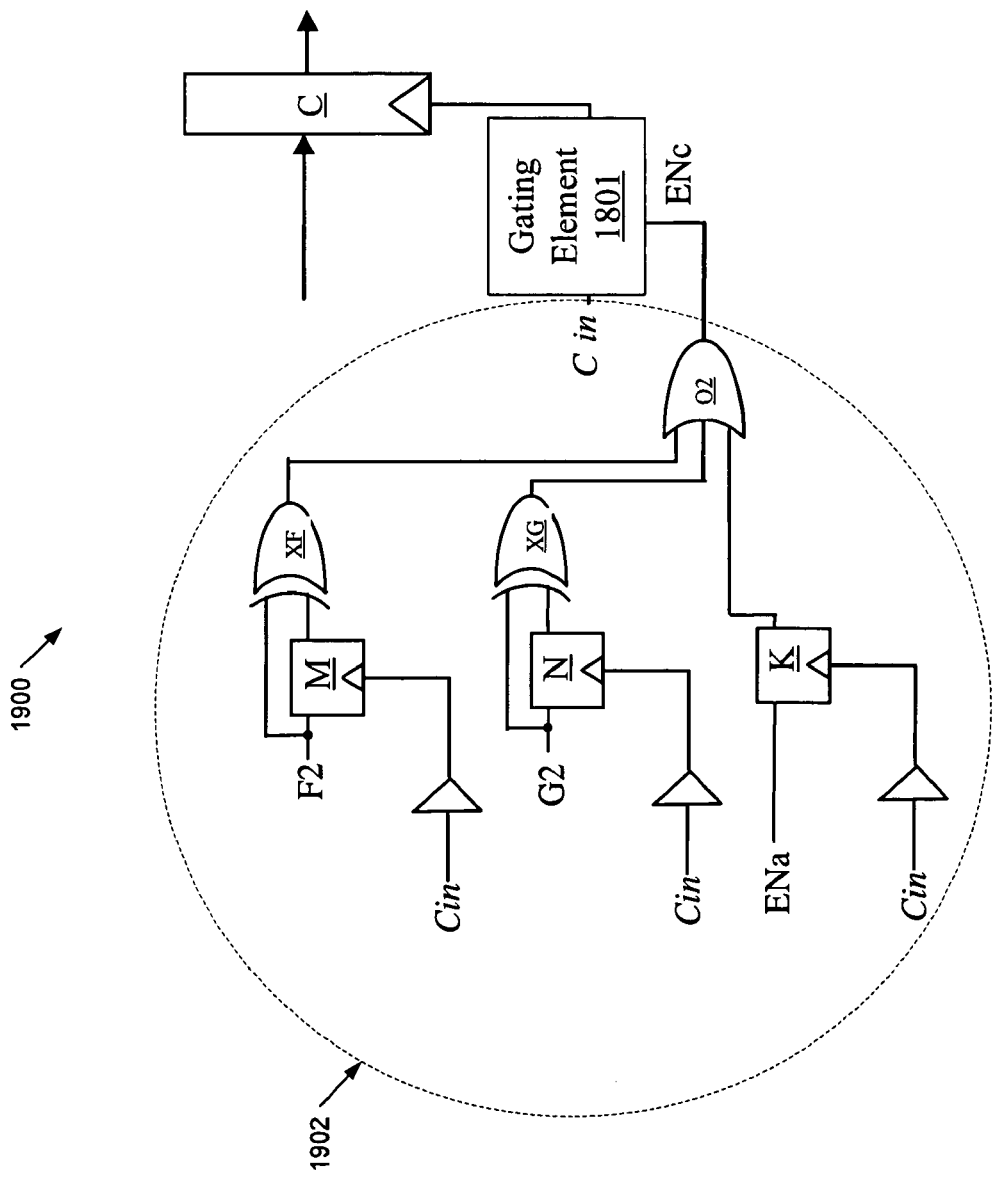

FIG. 19 shows an example circuit (1900) to illustrate generating the clock gating enable ENc for clock gating element (1801) of the register (C) that does not rely on the use of the inputs to storage elements (F) and (G) as described with respect to FIGS. 17 and 18 above. The circuit (1900) is essentially the same as the circuit (1700) or (1800) with the exception of the quiescence condition detector (1902). For clarity, only the quiescence condition detector (1902), the clock-gating element (1801), and the storage element (C) are shown in FIG. 19. Similar to the generation of the clock gating enables described with respect to FIGS. 8-11 above, two storage elements (M) and (N) are used in addition to the storage element (K). The output of the OR gate (O2) will only be 0 when F2, G2 and ENa have not changed in the previous cycle, and hence can be used directly as the enable ENc for register (C).

Figure 20:
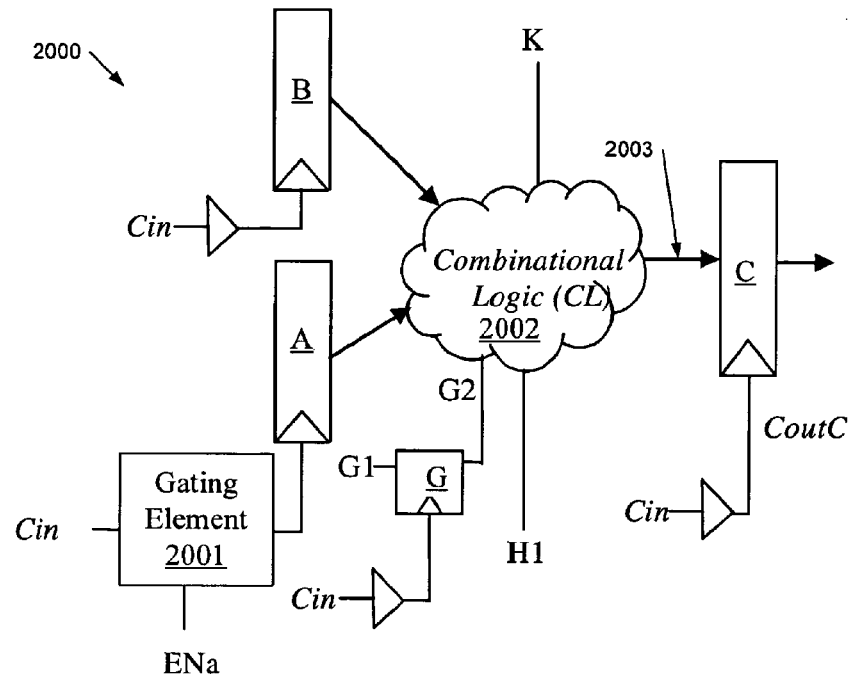

FIG. 20 shows a general framework in using feed-forward quiescent input analysis to clock-gate digital circuits. Here, a circuit (2000) includes two registers (A) and (B) which feed a third register (C) via the CL element (2002). The CL element (2002) includes control signal G2 sourced (i.e., generated) directly from a storage element (G) as well as control signals K and H1. Assume that in cycle N−1, an output (2003) of the CL element (2002) is sensitized exclusively from the outputs of register (A) (i.e., the outputs of register B do not affect the output (2003)) as a result of specific values only on control signals G2 and H1 (i.e. the control signal K does not affect the output (2003)). The value of output (2003) latched into register (C) at the start of cycle N is therefore exclusively determined by the data values in register (A) and the logic settings of control signals G2 and H1.

In cycle N, if the contents of register (A) stay unchanged from cycle N−1 (e.g., the value of ENa was 0 in cycle N−1 to suppress the clock to register (A) in cycle N using the clock gating element (2001)) and if control signals G2 and H1 retain their logic values from cycle N−1, the inputs to register (C) are identical to the values stored in its storage elements. In other words, the quiescent input condition is satisfied at register (C), therefore the clock at the beginning of cycle N+1 can be suppressed for register (C). This is the underlying concept used in the various embodiments of the present invention.

Figure 21:
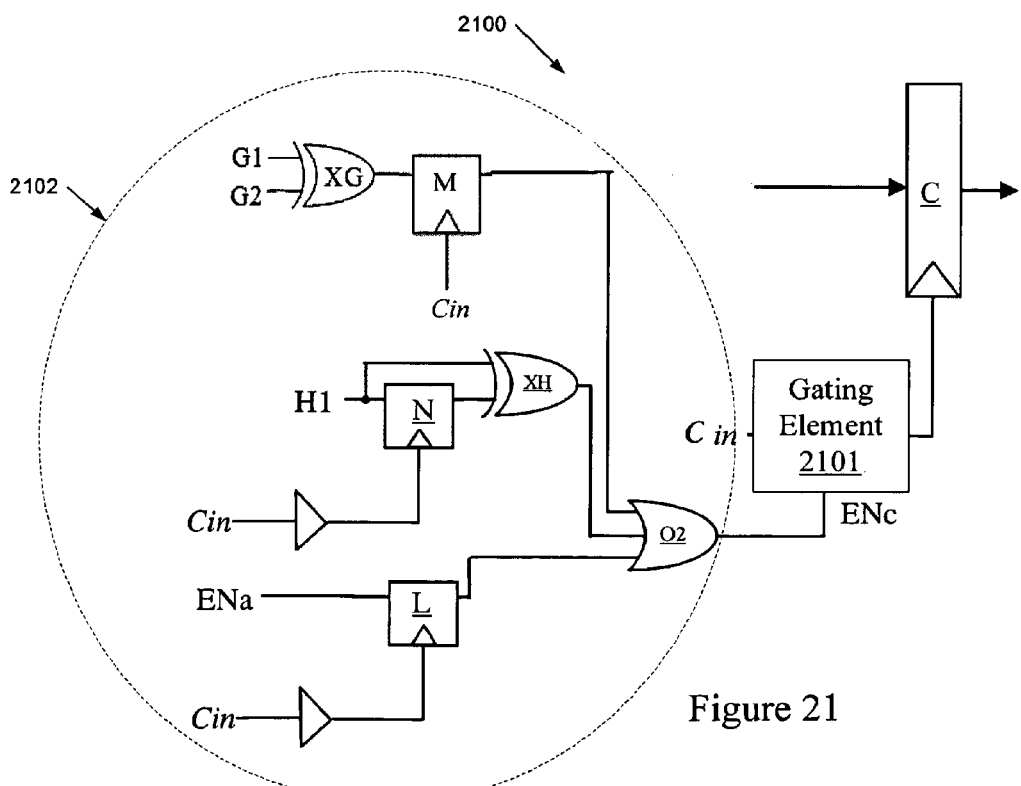

FIG. 21 shows a clock-gated version of circuit (2000), which is essentially the same as the circuit (2000) with the exception of the clock-gating element (2101). For clarity, only the relevant signals and gates used in generating the clock-gating logic are shown in FIG. 21. The quiescent condition detector (2102) includes (i) XOR gate (XG) with similar functionality as described with respect to the quiescent condition detector (1802) of FIG. 18 (ii) XOR gate (XH) and storage element (N) with similar functionality as described with respect to the quiescent condition detector (1902) of FIG. 19, and (iii) storage element (L) receiving ENa signal with similar functionality as described with respect to the quiescent condition detector (1902) of FIG. 19.

Figure 22A:
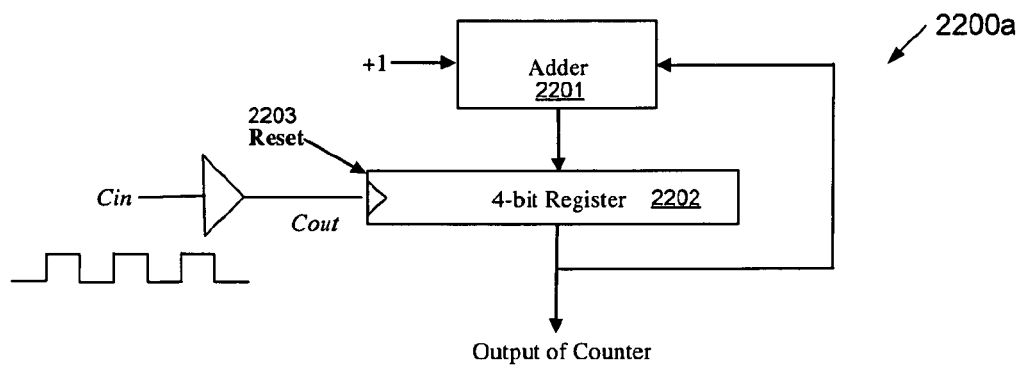

FIG. 22A shows a block diagram of a generic 4-bit binary counter (2200a) commonly used in many digital circuits. The counter may be initialized to an all-0 value, for example by a Reset signal (2203). On every subsequent clock cycle (i.e., of the Cout clock input to the sequential elements in the 4-bit register (2202) of the counter (2200a)) the value in the 4-bit register (2202) is incremented by 1 using the adder (2201). The outputs of the sequential elements in the register (2202) constitute the output of the counter (2200a). An example in clock-gating one or more of the sequential elements of the register (2200a) is shown in FIG. 22C. Those skilled in the art will appreciate that the clock-gating scheme may be extended to any n-bit counter. Note that the Cin and Cout nomenclature used for the clocks is not to be confused with the Carry-In and Carry-Out ports of the adder (2201).

Figure 22B:
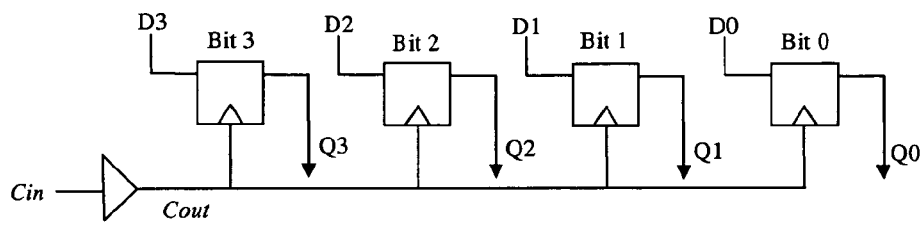
Figure 22C:
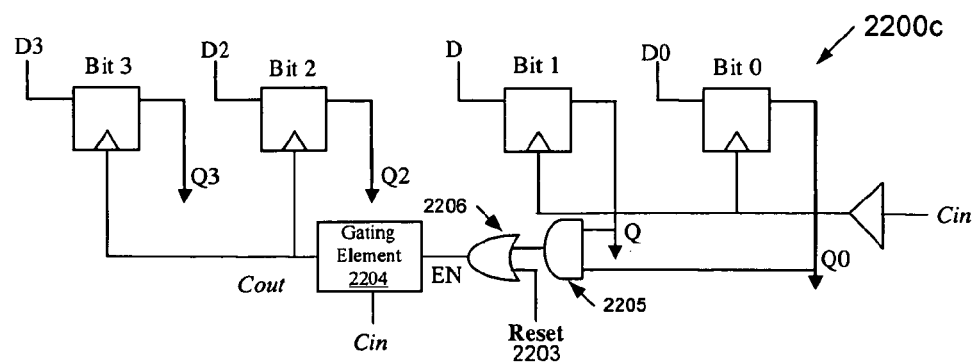

FIG. 22B shows details of the sequential elements Bit 3, Bit 2, Bit 1 and Bit 0 in the 4-bit register (2202) having inputs D3-D0 and outputs Q3-Q0, respectively within the counter (2200a). The Reset signal (2203) is omitted in FIG. 22B for clarity. Consider the input D2 to Bit 2 in the register (2202) after Reset (2203) is asserted and the counter (2200a) is operating in a free-running up-count mode. A required condition for the input D2 to switch from 0 to 1 or 1 to 0 is that both Q1 and Q0 be at a logic value of 1. In other words, the input D2 to Bit 2 will be identical to the value Q2 stored in the sequential element as long as Q0 and Q1 are NOT both at a logic value of 1. Hence the quiescence inducing condition for the input D2 is determined by the logic values of Q0 and Q1. To clock-gate Bit 2, the logic AND of Q1 and Q2 may be used as an enable function to a gating element for Bit 2.

FIG. 22C shows a clock-gated version (2200c) of the 4-bit counter (2200a) in which Bits 3 and 2 of the register (2202) are clock-gated. Bits 0 and 1 continue to be clocked by a buffered version of Cin as in FIG. 22B. However the Cout clock to Bits 3 and 2 is generated by the output of a gating element (2204) whose enable signal EN is derived as follows—the outputs Q0 and Q1 are combined via an AND gate (2205) and the output of AND gate (2205) is then combined with the Reset signal (2203) via an OR gate (2206) to derive the enable signal EN to the gating element (2204). In other words, the 4 bits of the counter (2200a) is partitioned into 2 groups, the LSB group (Bits 1 and 0) which is clocked in the same manner as the non-clock-gated counter (2200a), and the MSB group (Bits 3 and 2) which is clocked when (a) the Reset signal (2203) is asserted, or (b) all the outputs from the LSB group (Q0 and Q1) are at a logic value of 1. If the counter (2200a) saturates at a specific value (i.e., the largest possible value of the counter), the condition (b) may be further qualified with the condition that the counter (2200a) is not saturated.

Generally speaking, under the constraint that a single gating element (e.g., (2204)) is used, including the example described earlier (referred to as Alt 0) there are multiple ways to partition the register (2202) into a MSB and LSB group (specifically n−1 ways, where n is the number of counter bits). In any of these clock-gating schemes, a OR gate is used with the Reset signal (2203) as an input. For example (referred to as Alt 1), a single gating element may be used to clock-gate Bit 3 using an enable of the logic AND of outputs Q0, Q1 and Q2, and Bits 0, 1 and 2 continue to be clocked by a buffered version of Cin. Alternatively (referred to as Alt 2), a single gating element may be used to clock-gate Bits 3, 2 and 1 using an enable of Q0, and Bit 0 continues to be clocked by a buffered version of Cin.

In comparing the three alternatives (Alt 0-Alt2) that make use a single clock gating element, one of the key metrics to evaluate is the total number of clocks suppressed as a result of the clock gating. This in turn has a direct impact on the dynamic power savings achieved by the clock gating. In calculating the total number of clocks suppressed, the counter is assumed to be primarily in its counting mode, and not being reset frequently. For the original counter (2200a) shown in FIG. 22A, the total number of clocks used by the sequential elements in resetting and then counting from 0 to 15 is equal to 64 (16×4). In the clock-gated version shown in FIG. 22C, the total number of clocks used by the sequential elements is equal to 40 clock cycles this represents a savings of 24 cycles (38% savings). Similarly the percentage savings in clocks may be calculated for Alt1 and Alt2 as being equal to 22% and 38%, respectively. Hence from the perspective of power savings, both the version Alt 0 shown in FIG. 22C and Alt2 represent optimal solutions under the constraint of using a single clock gating element.

A second metric in evaluating the feasibility of a clock-gating solution is the area and timing overhead in generating the enable for the clock gating element. For example the clock-gated design in FIG. 22C makes use of a single 2-input AND gate (2205) to generate the enable signal (2203). Conversely, Alt2 would directly use Q0 (i.e. the output of Bit 0) as the enable signal and hence does not incur as much timing and area overhead as Alt 0 in FIG. 22C. In this way, tradeoffs are available between clock gating efficiencies (or equivalently the percentage savings in clocks) and the area and timing overhead of solutions to clock-gate any counter. Although the foregoing description has used an up-counter with an adder module, it will be evident to those skilled in the art that the invention may be used for different counter design styles (e.g., both up and down counting).

TABLE 1 shows one way to enable designers to analyze the various tradeoffs in using quiescent input analysis to clock-gate an n-bit counter partitioned into P (1<P<n) groups. Increasing the value of P (or equivalently the number of clock gating elements+1) provides another dimension to tradeoff clock gating efficiencies against both the area and timing overheads of the 'optimal' solution. In TABLE 1, for a 64-bit counter we show the clock gating efficiencies for values of P equal to 2 and 3 and estimates of the associated area and timing overheads are shown for each solution. The clock gating efficiency is computed on the basis of the average number of bits receiving clocks when counting from 0 to 63. The area overhead is computed on the basis of the number of bits in the single LSB group for P=2, and the sum of the bits in the two LSB groups (excluding the MSB group) for P=3. Counting the number of bits in the LSB groups correlates well to the complexity of logic required to generate the corresponding enables, and hence is a reasonable estimate of the area and timing overheads of the corresponding solution.

Consider the case of P=2 as shown in Table 1—this corresponds to the case where a single clock gating element is used to clock-gate the 64-bit counter. The optimal solution solely on the basis of clock gating efficiency is when k=5, i.e., the LSB group consists of bits 0-4, and the MSB group consists of bits 5-63. The 5 bits in the LSB group are ANDed to generate the clock enable for the 59 bits in the MSB group—the corresponding efficiency metric for this solution is 6.844. The next row labeled "area" shows the area estimate of the corresponding solution, and the last row labeled "combined" shows the sum of the clock gating efficiency metric and the area estimate of the solution. The optimal solution on the basis of accounting for both clock gating efficiency and the area overhead (as shown in the combined row) is with k=4, and the corresponding combined metric is 11.75. By presenting information to a designer in this fashion, the designer can study the various tradeoffs before deciding on a clock-gated design that satisfies specific design constraints and requirements.

Similarly in Table 1 for the case of P=3, possible clock-gating solutions on the basis of identifying the three partitions in the counter are shown. For example consider the solution when k1=4 and k2=2 this corresponds to the clock-gating solution where bits 0-3 (total of k1 bits) are clocked unconditionally, bits 4-5 (total of k2 bits) are clock-gated with a first clock gating element whose enable is the AND of bits 0-3, and bits 6-63 are clock-gated with a second clock gating element whose enable is the AND of bits 4-5. The optimal solution solely on the basis of clock-gating efficiency is when k1=2 and k2=5—the corresponding efficiency metric is 3.695 (highlighted in the #clk k1/k2 matrix under the P=3 section). Note that this efficiency is nearly twice as good as the optimal clock gating efficiency with P=2 (6.844)-the use of an additional clock gating element provides more suppression of clocks to the bits of the counter, and hence more savings in dynamic power. By taking into account the area overhead estimates of the clock-gating solution, the matrix labeled "combined" at the bottom of Table 1 shows the metrics in combining the clock gating efficiency and area estimate for various values of k1 and k2. In this combined matrix, the optimal solution is when k1=2 and k2=3, and the corresponding metric is 9.594 (highlighted in the combined k1/k2 matrix under the P=3 section). The area overheads as shown in Table 1 represent one simple way to estimate the area and timing overhead of the clock-gating solution—those well-versed in the art can employ more sophisticated techniques to estimate the area and combine it with the optimal clock gating efficiency values to gauge the overall "optimality" of a particular clock gating solution. The data presented in Table 1 can be generated for different counter length values and for values of P greater than 3. One can also present the data in a programmable fashion (e.g., via a spreadsheet or a computer program) to enable a designer to plug in different values (such as the number of counter bits or the means to calculate the area overhead of a clock-gated solution) and study the corresponding tradeoffs. Accordingly, the designer may finalize a clock gating partition of the counter based on the presented clocking efficiency metric and the area metric. Similarly, any counter circuit having multiple storage elements may be clock-gated in partitions using the approach described in the example counter circuit.

TABLE 1

| P = 2 - Two partitions (n − k)/k | | | | | | | | | | |
|---|---|---|---|---|---|---|---|---|---|---|
| | | | | | k | | | | | |
| | 1 | 2 | 3 | 4 | 5 | 6 | 7 | 8 | 9 | 10 | 11 |
| #clk | 32.5 | 17.5 | 10.63 | 7.75 | 6.844 | 6.906 | 7.445 | 8.219 | 9.107 | 10.05 | 11.03 |
| area | 1 | 2 | 3 | 4 | 5 | 6 | 7 | 8 | 9 | 10 | 11 |
| combined | 33.5 | 19.5 | 13.63 | 11.75 | 11.84 | 12.91 | 14.45 | 16.22 | 18.11 | 20.05 | 22.03 |

| P = 3 - Three partitions (n − k1 − k2)/k2/k1 | | | | | | | | | | |
|---|---|---|---|---|---|---|---|---|---|---|
| | | | | | #clk k2 | | | | | |
| | 1 | 2 | 3 | 4 | 5 | 6 | 7 | 8 | 9 | 10 | 11 |
| K1 = 1 | 17 | 9.625 | 6.25 | 4.844 | 4.406 | 4.445 | 4.719 | 5.107 | 5.553 | 6.026 | 6.513 |
| K1 = 2 | 9.875 | 6.25 | 4.594 | 3.906 | 3.695 | 3.719 | 3.857 | 4.053 | 4.276 | 4.513 | 4.756 |
| K1 = 3 | 6.875 | 5.094 | 4.281 | 3.945 | 3.844 | 3.857 | 3.928 | 4.026 | 4.138 | 4.256 | 4.378 |
| K1 = 4 | 5.906 | 5.031 | 4.633 | 4.469 | 4.42 | 4.428 | 4.463 | 4.513 | 4.569 | 4.628 | 4.689 |
| | | | | | area k2 | | | | | |
| | 1 | 2 | 3 | 4 | 5 | 6 | 7 | 8 | 9 | 10 | 11 |
| K1 = 1 | 2 | 3 | 4 | 5 | 6 | 7 | 8 | 9 | 10 | 11 | 12 |
| K1 = 2 | 3 | 4 | 5 | 6 | 7 | 8 | 9 | 10 | 11 | 12 | 13 |
| K1 = 3 | 4 | 5 | 6 | 7 | 8 | 9 | 10 | 11 | 12 | 13 | 14 |
| K1 = 4 | 5 | 6 | 7 | 8 | 9 | 10 | 11 | 12 | 13 | 14 | 15 |
| | | | | | combined k2 | | | | | |
| | 1 | 2 | 3 | 4 | 5 | 6 | 7 | 8 | 9 | 10 | 11 |
| K1 = 1 | 19 | 12.63 | 10.25 | 9.844 | 10.41 | 11.45 | 12.72 | 14.11 | 15.55 | 17.03 | 18.51 |
| K1 = 2 | 12.88 | 10.25 | 9.594 | 9.906 | 10.7 | 11.72 | 12.86 | 14.05 | 15.28 | 16.51 | 17.76 |
| K1 = 3 | 10.88 | 10.09 | 10.28 | 10.95 | 11.84 | 12.86 | 13.93 | 15.03 | 16.14 | 17.26 | 18.38 |
| K1 = 4 | 10.91 | 11.03 | 11.63 | 12.47 | 13.42 | 14.43 | 15.46 | 16.51 | 17.57 | 18.63 | 19.69 | clk = average clocking (average number of bits receiving clocks in counting 0 to 63)
area ~k (or k1 + k2)
n (#bits) = 64

Figure 23:
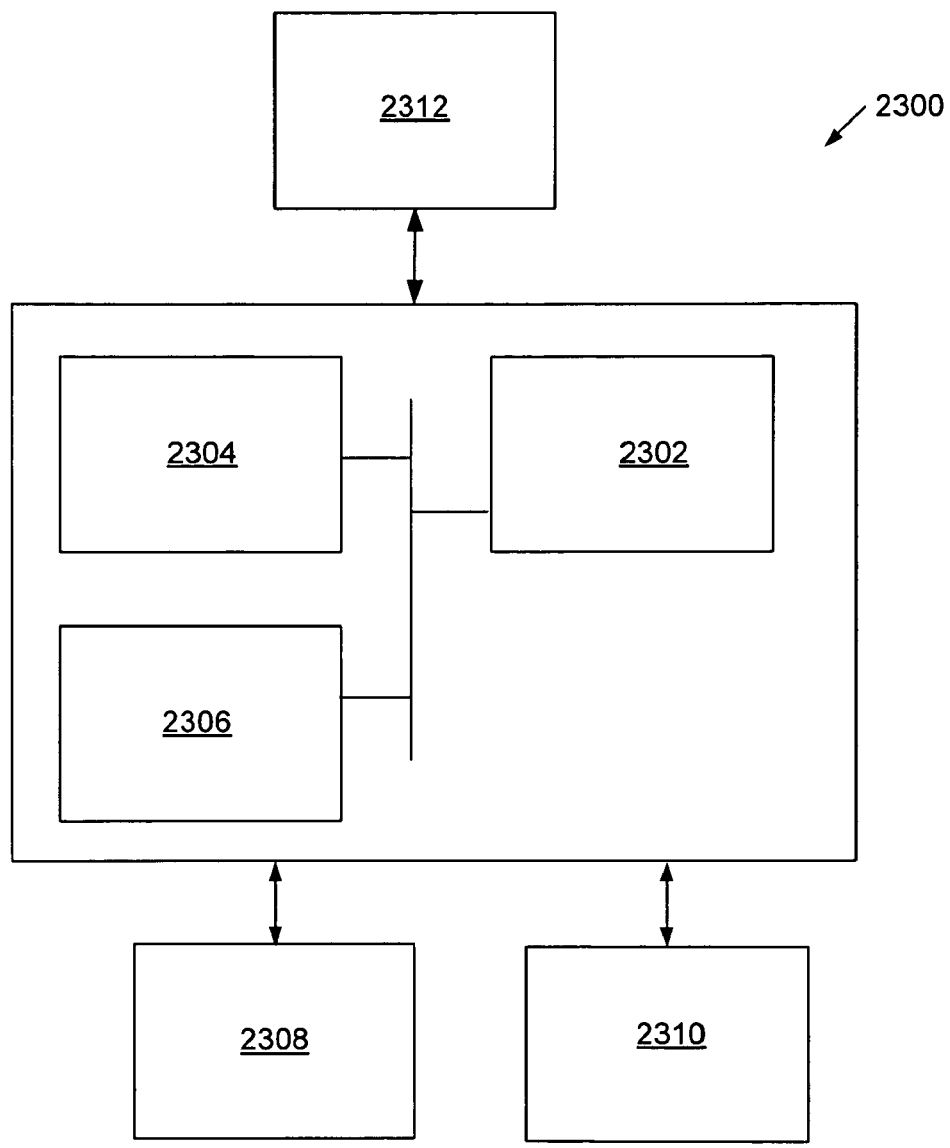
FIG. 23 shows an example computer system and computer readable medium according to aspects of the invention.

Embodiments of the invention may be implemented on virtually any type of computer regardless of the platform being used. For example, as shown in FIG. 23, a computer system (2300) includes a processor (2302), associated memory (2304), a storage device (2306), and numerous other elements and functionalities typical of today's computers (not shown). The computer (2300) may also include input means, such as a keyboard (2308) and a mouse (2310), and output means, such as a monitor (2312). The computer system (2300) is connected to a local area network (LAN) or a wide area network (e.g., the Internet) (not shown) via a network interface connection (not shown). Those skilled in the art will appreciate that other forms of computer readable medium may be used to substitute or complement the associated memory (2304) and the storage device (2306); in addition input and output means may take other forms.

Further, those skilled in the art will appreciate that one or more elements of the aforementioned computer system (2300) may be located at a remote location and connected to the other elements over a network. Further, the invention may be implemented on a distributed system having a plurality of nodes, where each portion of the invention may be located on a different node within the distributed system. In one embodiment of the invention, the node corresponds to a computer system. Alternatively, the node may correspond to a processor with associated physical memory. The node may alternatively correspond to a processor with shared memory and/or resources. Further, software instructions to perform embodiments of the invention may be stored on a computer readable medium such as a compact disc (CD), a diskette, a tape, a file, or any other physical computer readable storage device. Still further, representation of the circuit, circuit element, signal, input, output, etc. referred to in the description above of embodiments of the invention may be stored on the computer readable medium described above.

It will be understood from the foregoing description that various modifications and changes may be made in the preferred and alternative embodiments of the present invention without departing from its true spirit. This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. A device comprising:

a first storage element and a first clock gating element, wherein a data input of the first storage element is coupled to an output of a combinatorial logic (CL) element, wherein the first storage element is clock-gated with the first clock gating element using a first clock enable signal to generate a clock signal for the first storage element; and the CL element, wherein the output of the CL element is exclusively sensitized from at least one data input of the CL element by at least one control input of the CL element when each of the at least one control input of the CL element is in a first quiescence inducing condition with respect to the clock signal, wherein each of the at least one control input of the CL element does not change state between previous and current clock periods in the first quiescence inducing condition, wherein the first clock enable signal is generated, using the at least one data input of the CL element, the at least one control input of the CL element, and the clock signal, to suppress the clock signal in the first clock gating element when each of the at least one data input of the CL element is in a second quiescence inducing condition with respect to the clock signal at the same time as when each of the at least one control input of the CL element is in the first quiescence inducing condition, wherein each of the at least one data input of the CL element does not change state from the previous clock period to the current clock period in the second quiescence inducing condition.

2. The device of claim 1, further comprising:
a quiescent condition detector configured to compare a signal of the at least one control input of the CL element and the at least one data input of the CL element in the current clock period with a state of the signal in the previous clock period for detecting the first and second quiescence inducing conditions to generate the first clock enable signal.

3. The device of claim 1, further comprising:
a second storage element and a second clock-gating element,
wherein a signal of the at least one data input of the CL element is coupled to an output of the second storage element clock-gated with the second clock gating element using a second clock enable signal to generate the clock signal for the second storage element, and
wherein the first clock enable signal is generated using the second clock enable signal.

4. A computer readable medium storing a representation of a circuit, the representation comprising:
a first portion representing a first storage element and a first clock gating element in the circuit, wherein a data input of the first storage element is coupled to an output of a combinatorial logic (CL) element in the circuit, wherein the first storage element is clock-gated with the first clock gating element using a first clock enable signal to generate a clock signal for the first storage element; and
a second portion representing the CL element in the circuit, wherein the output of the CL element is exclusively sensitized from at least one data input of the CL element by at least one control input of the CL element when each of the at least one control input of the CL element is in a first quiescence inducing condition with respect to the clock signal, wherein each of the at least one control input of the CL element does not change state between previous and current clock periods in the first quiescence inducing condition,
wherein the first clock gating element is configured to generate the first clock enable signal, using the at least one data input of the CL element, the at least one control input of the CL element, and the clock signal, to suppress the clock signal in the first clock gating element when each of the at least one data input of the CL element is in a second quiescence inducing condition with respect to the clock signal at the same time as when each of the at least one control input of the CL element is in the first quiescence inducing condition, wherein each of the at least one data input of the CL element does not change state from the previous clock period to the current clock period in the second quiescence inducing condition.

5. The computer readable medium of claim 4, the representation further comprising:
a third portion representing a quiescent condition detector configured at least to compare a signal of the at least one control input of the CL element and the at least one data input of the CL element in the current clock period with a state of the signal in the previous clock period for detecting the first and second quiescence inducing conditions to generate the first clock enable signal.

6. The computer readable medium of claim 4, the representation further comprising:
a fourth portion representing a second storage element and a second clock-gating element in the circuit,
wherein a signal of the at least one data input of the CL element is coupled to an output of the second storage element clock-gated with the second clock gating element using a second clock enable signal to generate the clock signal for the second storage element, and
wherein the first clock enable signal is generated using the second clock enable signal.

7. A method to clock-gate a circuit, comprising:
identifying a first storage element and a combinatorial logic (CL) element in the circuit, wherein the first storage element is clocked by a clock signal, wherein a data input of the first storage element is coupled to an output of the CL element in the circuit;
identifying a first quiescence inducing condition of at least one control input of the CL element with respect to the clock signal, wherein each of the at least one control input of the CL element does not change state between previous and current clock periods in the first quiescence inducing condition, wherein the output of the CL element is exclusively sensitized from at least one data input of the CL element by the at least one control input of the CL element when each of the at least one control input of the CL element is in the first quiescence inducing condition;
identifying a second quiescence inducing condition of the at least one data input of the CL element with respect to the clock signal, wherein each of the at least one data input of the CL element does not change state between previous and current clock periods in the second quiescence inducing condition,
providing a first clock gating element, wherein the first storage element is clock-gated with the first clock gating element using a first clock enable signal to generate a clock signal for the first storage element,
wherein the first clock gating element is configured to generate the first clock enable signal, using the at least one data input of the CL element, the at least one control input of the CL element, and the clock signal, to suppress the clock signal in the first clock gating element when each of the at least one data input of the CL element is in the second quiescence inducing condition at the same time as when each of the at least one control input of the CL element is in the first quiescence inducing condition.

8. The method of claim 7, further comprising:
providing a quiescent condition detector configured to compare a signal of the at least one control input of the CL element and the at least one data input of the CL element in the current clock period with a state of the signal in the previous clock period for detecting the first and second quiescence inducing conditions to generate the first clock enable signal.

9. The method of claim 7, further comprising:
identifying a signal of the at least one data input of the CL element being coupled to an output of a second storage element clock-gated with a second clock gating element using a second clock enable signal to generate the clock signal for the second storage element; and
providing a quiescent condition detector configured at least to generate the first clock enable signal using the second clock enable signal.

10. The method of claim 7, wherein the circuit comprises a plurality of storage elements, the method further comprising:
identifying a portion of the plurality of storage elements as a first partition comprising the first storage element;
determining a clock efficiency metric and an area metric if the portion of the plurality of storage elements in the first partition is clocked using the clock signal and clock-gated with the first clock gating element using the first clock enable signal; and
presenting the clock efficiency metric and the area metric to a user for determining a final clock gating partition of the circuit.

11. A computer readable medium storing instructions when executed by a processor comprising functionalities for:
identifying a first storage element in the circuit, wherein the first storage element is clocked by a clock signal, wherein a data input of the first storage element is coupled to an output of a combinatorial logic (CL) element in the circuit;
identifying a first quiescence inducing condition of the at least one control input of the CL element with respect to the clock signal, wherein each of the at least one control input of the CL element does not change state between previous and current clock periods in the first quiescence inducing condition, wherein the output of the CL element is exclusively sensitized from at least one data input of the CL element by the at least one control input of the CL element when each of the at least one control input of the CL element is in the first quiescence inducing condition;
identifying a second quiescence inducing condition of at least one data input of the CL element with respect to the clock signal, wherein each of the at least one data input of the CL element does not change state between previous and current clock periods in the second quiescence inducing condition;
providing a first clock gating element, wherein the first storage element is clock-gated with the first clock gating element using a first clock enable signal to generate a clock signal for the first storage element; and
wherein the first clock gating element is configured to generate the first clock enable signal, using the at least one data input of the CL element, the at least one control input of the CL element, and the clock signal, to suppress the clock signal in the first clock gating element when each of the at least one data input of the CL element is in the second quiescence inducing condition at the same time as when each of the at least one control input of the CL element is in the first quiescence inducing condition.

12. The computer readable medium of claim 11, the instructions when executed by a processor further comprising functionalities for:
providing a quiescent condition detector configured at least to compare a signal of the at least one control input of the CL element and the at least one data input of the CL element in the current clock period with a state of the signal in the previous clock period for detecting the first and second quiescence inducing conditions to generate the first clock enable signal.

13. The computer readable medium of claim 11, the instructions when executed by a processor further comprising functionalities for:
identifying a signal of the at least one data input of the CL element being coupled to an output of a second storage element clock-gated with a second clock gating element using a second clock enable signal to generate the clock signal for the second storage element; and
providing a quiescent condition detector configured to generate the first clock enable signal using the second clock enable signal.

14. The computer readable medium of claim 11, the instructions when executed by a processor further comprising functionalities for:
identifying a portion of the plurality of storage elements as a first partition comprising the first storage element;
determining a clock efficiency metric and an area metric if the portion of the plurality of storage elements in the first partition is clocked using the clock signal and clock-gated with the first clock gating element using the first clock enable signal; and
presenting the clock efficiency metric and the area metric to a user for determining a final clock gating partition of the circuit.

* * * * *